US010256824B2

(12) United States Patent
Isozaki

(10) Patent No.: US 10,256,824 B2
(45) Date of Patent: Apr. 9, 2019

(54) D/A CONVERTER, CIRCUIT DEVICE, OSCILLATOR, ELECTRONIC APPARATUS AND MOVING OBJECT

(71) Applicant: Seiko Epson Corporation, Tokyo (JP)

(72) Inventor: Shigenori Isozaki, Tatsuno (JP)

(73) Assignee: Seiko Epson Corporation (JP)

( * ) Notice: Subject to any disclaimer, the term of this patent is extended or adjusted under 35 U.S.C. 154(b) by 168 days.

(21) Appl. No.: 15/368,935

(22) Filed: Dec. 5, 2016

(65) Prior Publication Data

US 2017/0170832 A1  Jun. 15, 2017

(30) Foreign Application Priority Data

Dec. 14, 2015 (JP) ................................ 2015-242798

(51) Int. Cl.
| | |
|---|---|
| *H03B 5/32* | (2006.01) |
| *H03L 1/02* | (2006.01) |
| *H03M 1/76* | (2006.01) |
| *H03M 1/46* | (2006.01) |
| *H03M 1/66* | (2006.01) |
| *H03M 7/30* | (2006.01) |
| *H03M 1/68* | (2006.01) |
| *H02M 3/158* | (2006.01) |

(52) U.S. Cl.
CPC ............ *H03L 1/026* (2013.01); *H03B 5/32* (2013.01); *H03L 1/022* (2013.01); *H03L 1/028* (2013.01); *H03M 1/46* (2013.01); *H03M 1/66* (2013.01); *H03M 1/68* (2013.01); *H03M 1/76* (2013.01); *H03M 7/30* (2013.01); *H02M 3/158* (2013.01); *H03M 1/661* (2013.01)

(58) Field of Classification Search
CPC ... H03M 1/76; G09G 2310/027; H03L 1/028; H03L 1/022; H03L 1/025; H03L 1/026
See application file for complete search history.

(56) References Cited

U.S. PATENT DOCUMENTS

| | | | | |
|---|---|---|---|---|
| 6,075,477 A | * | 6/2000 | Kokubun | ............ H03M 1/0602 341/118 |
| 6,417,827 B1 | * | 7/2002 | Nagao | ................. G09G 3/2011 345/204 |

(Continued)

FOREIGN PATENT DOCUMENTS

| | | |
|---|---|---|
| JP | 61-010324 A | 1/1986 |
| JP | 2007-124428 A | 5/2007 |

(Continued)

*Primary Examiner* — Ryan Johnson
(74) *Attorney, Agent, or Firm* — Harness, Dickey & Pierce, P.L.C.

(57) ABSTRACT

A D/A converter includes a decoder, a voltage selection circuit, and a voltage selection circuit. The voltage selection circuit includes a plurality of stages of selector blocks in which output of a selector of the selector block at the previous stage is input to a selector of the selector block at the subsequent stage. A plurality of voltages are input to the selector block at the first stage, and the selector block at the final stage outputs a D/A-converted voltage. Each of the plurality of stages of selector blocks includes a plurality of transistors and, of the plurality of transistors forming the selector block, a second transistor on a far side from a power source node is set to a lower threshold voltage than that of a first transistor on a near side from the power source node.

21 Claims, 18 Drawing Sheets

(56) References Cited

U.S. PATENT DOCUMENTS

| | | |
|---|---|---|
| 7,940,256 B2 | 5/2011 | Takahashi |
| 8,174,475 B2 | 5/2012 | Nishimura et al. |
| 8,446,403 B2 | 5/2013 | Tsuchi et al. |
| 2001/0022539 A1* | 9/2001 | Jakobsson ............. H03J 1/0058 331/172 |
| 2014/0009373 A1* | 1/2014 | Cheng ..................... G09G 3/36 345/89 |

FOREIGN PATENT DOCUMENTS

| | | |
|---|---|---|
| JP | 2009-118457 A | 5/2009 |
| JP | 2011-172100 A | 9/2011 |

\* cited by examiner

FIG. 3A

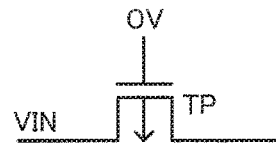

ON CONDITION : $VIN > VTP + VBS + VPR + VTS$
                              ↑         ↑        ↑
                     SUBSTRATE  PROCESS  TEMPERATURE
                       BIAS    FLUCTUATIONS FLUCTUATIONS
                      EFFECT

OFF CONDITION : $VTP - VPR - VTS > 0$
                        ↑       ↑
                     PROCESS  TEMPERATURE
                   FLUCTUATIONS FLUCTUATIONS

FIG. 3B

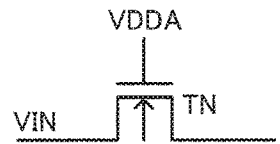

ON CONDITION : $VDDA - VIN > VTN + VBS + VPR + VTS$
                                      ↑         ↑        ↑
                             SUBSTRATE  PROCESS  TEMPERATURE
                               BIAS    FLUCTUATIONS FLUCTUATIONS
                              EFFECT

OFF CONDITION : $VTN - VPR - VTS > 0$
                        ↑       ↑
                     PROCESS  TEMPERATURE
                   FLUCTUATIONS FLUCTUATIONS

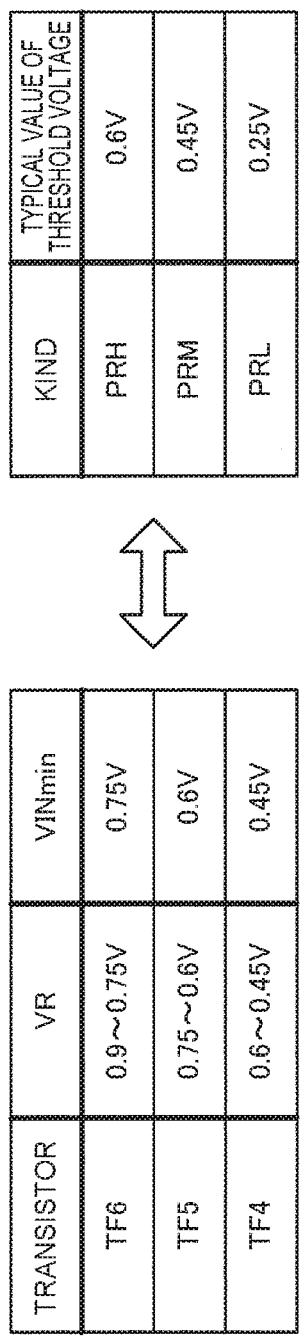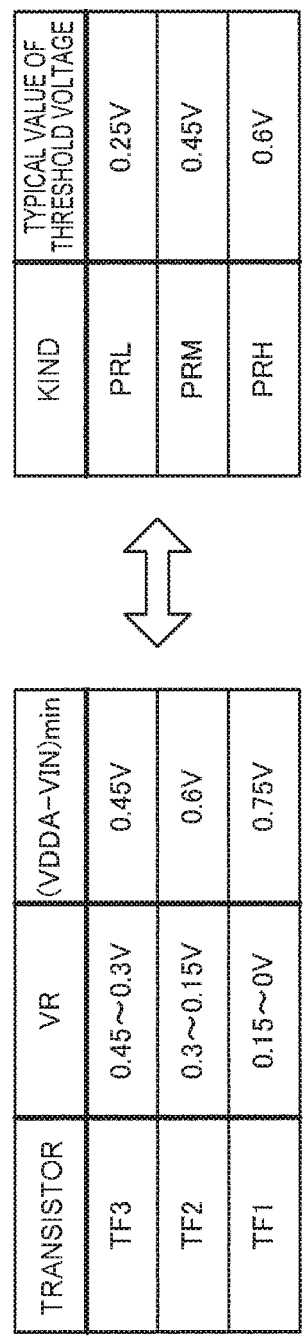
FIG. 4A
FIG. 4B

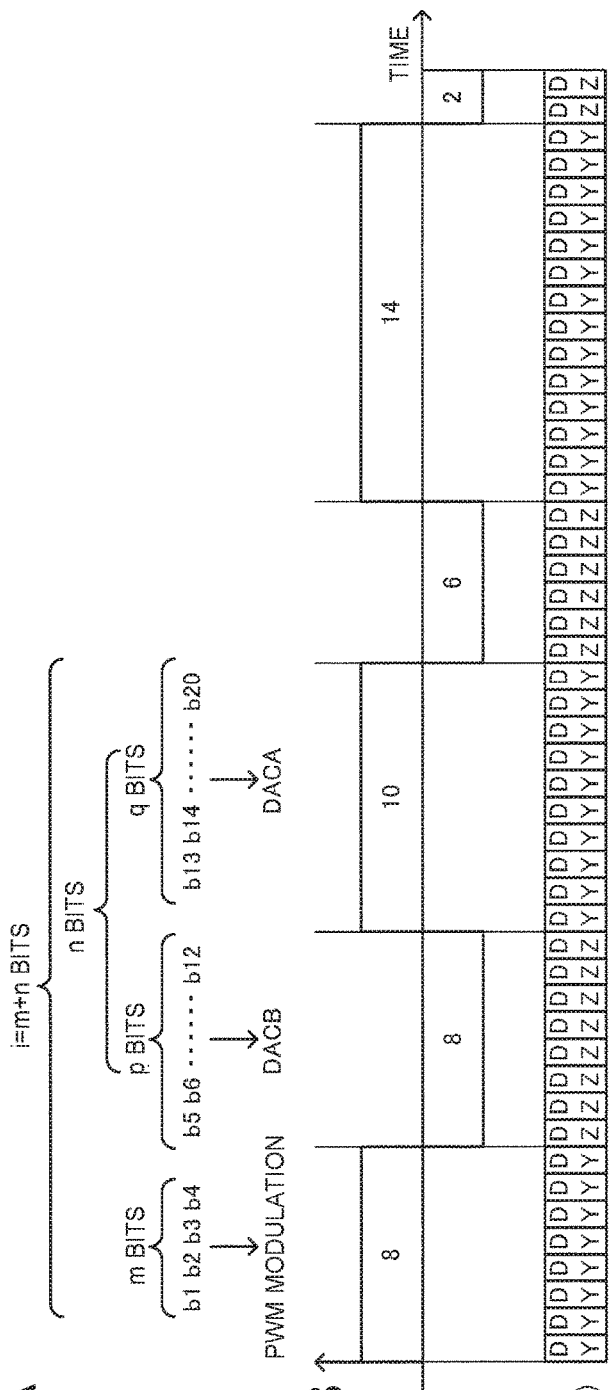

D/A CONVERTER, CIRCUIT DEVICE, OSCILLATOR, ELECTRONIC APPARATUS AND MOVING OBJECT

BACKGROUND

1. Technical Field

The present invention relates to a D/A converter, a circuit device, an oscillator, an electronic apparatus, and a moving object.

2. Related Art

In related art, D/A converters that convert digital data into analog voltages are used in circuit devices for oscillators such as temperature-compensated oscillators, circuit devices of display drivers that drive liquid crystal panels, etc. For example, a D/A converter is used for D/A conversion of frequency control data in a circuit device for temperature-compensated oscillator. Or, a D/A converter is used in an A/D conversion unit that A/D-converts a temperature detection voltage. A D/A converter is used as a circuit for selecting a gradation voltage corresponding to display data from a plurality of gradation voltages in a circuit device of a display driver. For example, Patent Document 1 (JP-A-2009-118457) discloses a configuration example of a D/A converter used for the circuit device of the display driver.

In the D/A converter disclosed in Patent Document 1, a voltage corresponding to input data is selected from a plurality of input voltages, and thereby, a D/A-converted voltage corresponding to the input data is output. A voltage selection circuit of the D/A converter has a plurality of selector blocks and a voltage is selected using these selector blocks in the so-called tournament, and thereby, a D/A-converted voltage corresponding to an input voltage is obtained.

In the D/A converter, there is a need for lower power consumption. For example, the D/A converter has a voltage generation circuit, and the voltage generation circuit generates a plurality of voltages to be input to the voltage selection circuit by voltage division of a power source voltage using a plurality of series-connected resistors. A current constantly flows in the series-connected resistors. Accordingly, to realize the lower power consumption of the D/A converter, it is desirable to set the power source voltage supplied to the voltage generation circuit to be as low as possible. Further, also, for lower power consumption of other circuits than the D/A converter of the circuit device, it is desirable to set the power source voltage to be as low as possible.

However, the selectors forming the voltage selection circuit include P-type and N-type transistors, and it has been turned out that, if the power source voltage is lower, various conditions such as on conditions and off conditions of these transistors are harder to be satisfied.

SUMMARY

An advantage of some aspects of the invention is to provide a D/A converter, a circuit device, an oscillator, an electronic apparatus, a moving object, etc. that may output a D/A-converted voltage by proper voltage selection with lower power consumption.

An aspect of the invention relates to a D/A converter including a decoder that performs decoding processing of input data and outputs a control signal, a voltage generation circuit that generates and outputs a plurality of voltages, and a voltage selection circuit that selects and outputs a voltage corresponding to the input data as a D/A-converted voltage from the plurality of voltages based on the plurality of voltages from the voltage generation circuit and the control signal from the decoder, wherein the voltage selection circuit includes a plurality of stages of selector blocks in which output of a selector of the selector block at the previous stage is input to a selector of the selector block at the subsequent stage, the plurality of voltages are input to the selector block at the first stage of the plurality of stages of selector blocks, and the selector block at the final stage of the plurality of stages of selector blocks outputs the D/A-converted voltage, and each of the plurality of stages of selector blocks includes a plurality of transistors and, of the plurality of transistors forming the selector block, a second transistor on a far side from a power source node is set to a lower threshold voltage than that of a first transistor on a near side from the power source node.

According to the aspect of the invention, the plurality of voltages generated by the voltage generation circuit are input to the selector block at the first stage of the voltage selection circuit, and the D/A-converted voltage corresponding to the input data is output from the selector block at the final stage is output by voltage selection based on the control signal from the decoder. Then, of the plurality of transistors forming the selector block, the second transistor on the far side from the power source node is set to the lower threshold voltage than that of the first transistor on the near side from the power source node. According to the configuration, for example, even when the power source voltage is set to a lower voltage for lower power consumption, proper voltage selection by the voltage selection circuit may be realized because the second transistor on the far side from the power source node is set to the lower threshold voltage. Therefore, the D/A converter that may perform proper voltage selection with lower power consumption and output the D/A-converted voltage can be provided.

In the aspect of the invention, of the plurality of transistors forming the selector block, a second P-type transistor on a far side from a high-potential-side power source node may be set to a lower threshold voltage than that of a first P-type transistor on a near side from the high-potential-side power source node, and a second N-type transistor on a far side from a low-potential-side power source node may be set to a lower threshold voltage than that of a first N-type transistor on a near side from the low-potential-side power source node.

According to the configuration, regarding the P-type transistors, the second P-type transistor on the far side from the high-potential-side power source node is set to the lower threshold voltage and, regarding the N-type transistors, the second N-type transistor on the far side from the low-potential-side power source node is set to the lower threshold voltage, and thereby, both lower power consumption and proper voltage selection may be realized.

In the aspect of the invention, the first transistor may be a first kind of transistor having a first threshold voltage as a typical value of the threshold voltage, and the second transistor may be a second kind of transistor having a second threshold voltage lower than the first threshold voltage as a typical value of the threshold voltage.

According to the configuration, the threshold voltage of the second transistor may be set to the lower voltage by setting of the kinds of transistors.

In the aspect of the invention, the first transistor and the second transistor may be different in gate length.

According to the configuration, fine adjustment of the threshold voltages of the second transistor etc. can be performed by setting of the gate lengths.

In the aspect of the invention, of the plurality of transistors forming the selector block, a third transistor on a farther side from the power source node than the second transistor may be set to a lower threshold voltage than that of the second transistor.

According to the configuration, the threshold voltage of the third transistor on the farther side from the power source node than the second transistor is set to the lower voltage, and thereby, even in the case where the power source voltage is set to the even lower voltage or the like, both lower power consumption and proper voltage selection may be realized.

In the aspect of the invention, the first transistor may be a first kind of transistor having a first threshold voltage as a typical value of the threshold voltage, the second transistor may be a second kind of transistor having a second threshold voltage lower than the first threshold voltage as a typical value of the threshold voltage, and the third transistor may be a third kind of transistor having a third threshold voltage lower than the second threshold voltage as a typical value of the threshold voltage.

According to the configuration, the threshold voltages of the second, third transistors may be set to the lower voltages by setting of the kinds of transistors.

In the aspect of the invention, at least one transistor of the first, second, third transistors may be different in gate length from the other transistors of the first, second, third transistors.

According to the configuration, fine adjustment of the threshold voltages of the second, third transistors etc. can be performed by setting of the gate lengths.

In the aspect of the invention, the first transistor and the second transistor may be different in manufacturing process parameter of the transistors and set to different threshold voltages.

According to the configuration, the threshold voltage of the second transistor may be set to the lower voltage by setting of the manufacturing process parameter of the transistors.

In the aspect of the invention, a gate length of at least one transistor forming the selector block at the final stage may be longer than gate lengths of the other transistors forming the selector block at the final stage.

According to the configuration, in the plurality of transistors forming the selector block at the final stage, fine adjustment of the threshold voltages for satisfying various conditions including on conditions and off conditions may be realized.

In the aspect of the invention, a gate length of at least one transistor forming the selector block at the final stage may be longer than gate lengths of the transistors forming the selector block at the first stage.

According to the configuration, the threshold voltage of the transistor forming the selector block at the final stage, which is harder to satisfy the on condition or the like than the transistors forming the selector block at the first stage, can be finely adjusted by setting of the gate length.

In the aspect of the invention, at least one transistor forming the selector block at the final stage may be a transistor at a controlled substrate voltage.

According to the configuration, the threshold voltage of the transistor forming the selector block at the final stage, which is harder to satisfy the on condition or the like, can be finely adjusted by control of the substrate voltage.

In the aspect of the invention, a selector of the selector block at the final stage may be a selector to which I (I≥3) voltages are input from the selector block at the previous block and from which the single D/A-converted voltage is output.

According to the configuration, for example, compared to the case where a 2-input/1-output selector is used as the selector on the final stage, the input voltage range of the transistor forming the selector at the final stage may be made narrower and setting of the threshold voltage that satisfy the on condition or the like of the transistor may be made easier.

Another aspect of the invention relates to a circuit device including the above described D/A converter, and a power source circuit that supplies a power source voltage to the D/A converter, wherein the power source circuit has a reference voltage generation circuit that generates a reference voltage generated based on a work function difference between the transistors, and supplies the reference voltage generated by the reference voltage generation circuit to the D/A converter as the power source voltage.

The power source voltage generated based on the work function difference by the reference voltage generation circuit is supplied to the D/A converter, and thereby, lower power consumption than that in the case of using a reference voltage generation circuit of another circuit type may be realized. Further, even in the case where the power source voltage generated by the reference voltage generation circuit is the lower voltage, the D/A converter may perform proper voltage selection and both lower power consumption and proper voltage selection may be realized.

Another aspect of the invention relates to a circuit device including the above described D/A converter, an A/D conversion unit that performs A/D conversion of a temperature detection voltage from a temperature sensor unit and outputs temperature detection data, a processing unit that performs temperature compensation processing of an oscillation frequency based on the temperature detection data and outputs frequency control data for the oscillation frequency, and an oscillation signal generation circuit that generates an oscillation signal at the oscillation frequency set by the frequency control data using the frequency control data from the processing unit and a vibrator, wherein the oscillation signal generation circuit includes a D/A conversion unit that has the D/A converter and performs D/A conversion of the frequency control data from the processing unit, and an oscillation circuit that generates the oscillation signal using an output voltage of the D/A conversion unit and the vibrator.

According to the configuration, the D/A conversion of the frequency control data can be performed using the D/A converter that can perform proper voltage selection with lower power consumption, and thereby, both lower power consumption and improvement in performance of the circuit device may be realized.

Another aspect of the invention relates to an oscillator including the above described circuit device and the vibrator.

Another aspect of the invention relates an electronic apparatus including the above described D/A converter.

A moving object according to another aspect of the invention includes the above described D/A converter.

BRIEF DESCRIPTION OF THE DRAWINGS

The invention will be described with reference to the accompanying drawings, wherein like numbers reference like elements.

FIGS. 3A and 3B are explanatory diagrams of on conditions and off conditions of transistors.

FIGS. 4A and 4B are explanatory diagrams of a technique of setting threshold voltages of the embodiment.

FIGS. 17A, 17B, 17C are explanatory diagrams of PWM modulation.

DESCRIPTION OF EXEMPLARY EMBODIMENTS

As below, a preferred embodiment of the invention will be explained in detail. The embodiment to be explained does not unduly limit the invention described in the appended claims, and not all of the configurations to be explained in the embodiment are essential as solving means of the invention.

1. Configuration of D/A Converter

Figure 1:
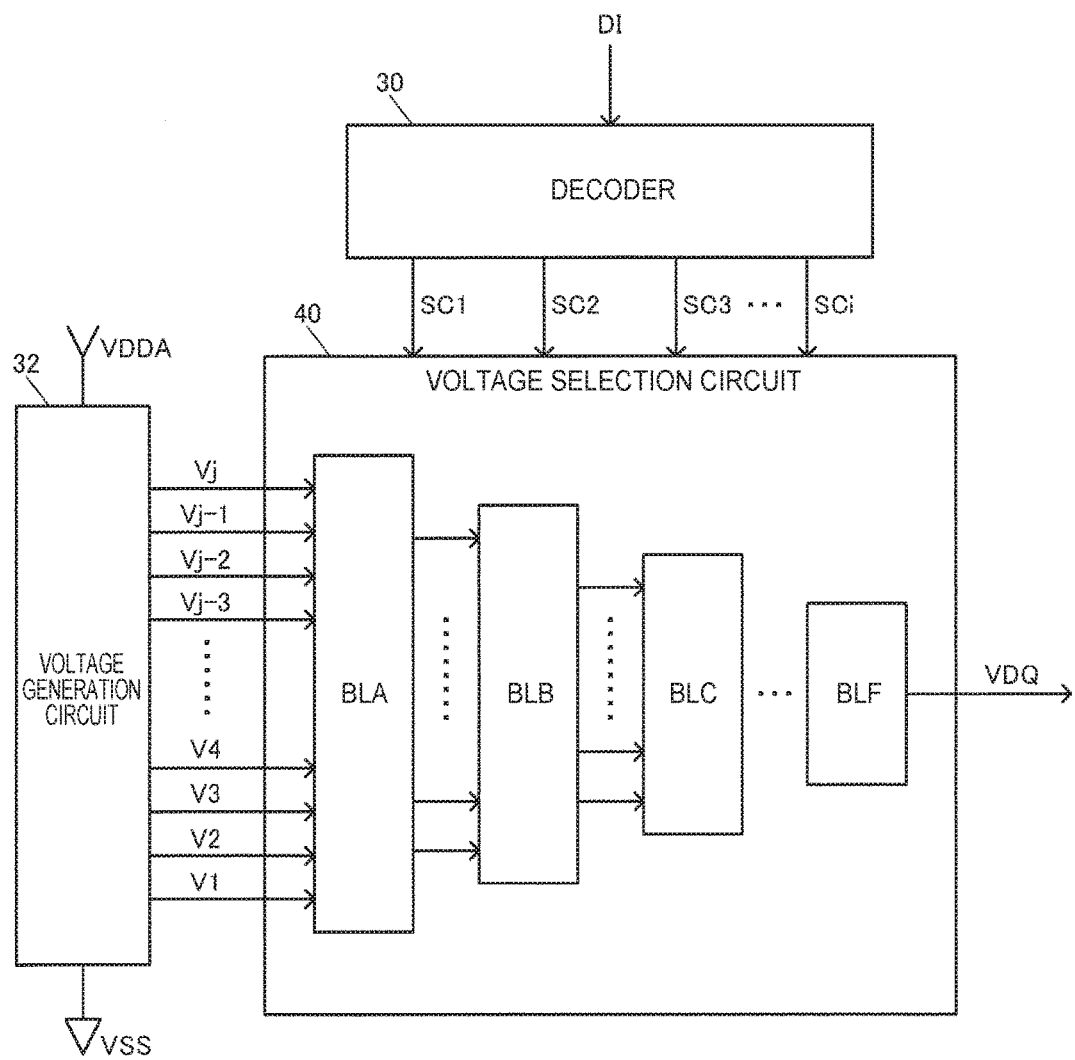
FIG. 1 shows a configuration example of a D/A converter of an embodiment.

FIG. 1 shows a configuration example of a D/A converter of the embodiment. The D/A converter include a decoder 30, a voltage generation circuit 32, and a voltage selection circuit 40. The configuration of the D/A converter is not limited to the configuration in FIG. 1, but various modifications such that part of the component elements is omitted and another component element is added may be made.

The decoder 30 (switching control circuit) performs decoding processing of input data DI and outputs control signals SC1 to SCi (i is an integer equal to or larger than two). The input data DI is data to be D/A-converted. The control signals SC1 to SCi are signals for turning on or off transistors forming selectors of the voltage selection circuit 40. The transistors corresponding to the respective control signals (the transistors having gates to which the control signals or inversion signals are input) are turned on or off according to the voltage levels of the respective control signals SC1 to SCi. The control signal SC1 corresponds to a lower bit of the input data DI and the control signal SCi corresponds to an upper bit of the input data DI. The decoding processing performed by the decoder 30 is known processing and the detailed explanation is omitted.

The voltage generation circuit 32 generates and outputs a plurality of voltages V1 to Vj (j is an integer equal to or larger than two). For example, the voltage generation circuit 32 has a plurality of resistors series-connected between power sources (high-potential-side power source VDDA and low-potential-side power source VSS), and outputs voltages formed by voltage division using these resistors as the plurality of voltages V1 to Vj. These plurality of voltages V1 to Vj are voltages formed by equal division of the voltage between the power sources (between VDDA and VSS), for example. Note that the plurality of voltages V1 to Vj may be gradation voltages for image display on a display panel such as a liquid crystal panel. In this case, the plurality of voltages V1 to Vj are voltages according to the gradation characteristics of the display panel.

The voltage selection circuit 40 performs voltage selection based on the plurality of voltages V1 to Vj and outputs a D/A-converted voltage VDQ. Specifically, the voltage selection circuit 40 selects and outputs a voltage corresponding to the input data DI as the D/A-converted voltage VDQ from the plurality of voltages V1 to Vj based on the plurality of voltages V1 to Vj from the voltage generation circuit 32 and the control signals SC1 to SCi from the decoder 30. In other words, the voltage obtained by D/A conversion of the input data DI is output as the D/A-converted voltage VDQ.

The voltage selection circuit 40 includes a plurality of selector blocks BLA, BLB, BLC . . . BLF. The number of stages of the selector blocks is at least two or more. Each of the selector blocks BLA . . . BLF includes one or more selectors and each selector includes e.g. a MOS transistor. The output of the selector of the selector block at the previous stage is input to the selector of the selector block at the subsequent stage. Specifically, the output of the selector of the first (previous) block BLA is input to the second (subsequent) selector block BLB. The output of the selector of the second (previous) block BLB is input to the third (subsequent) selector block BLC. The output of the selector of the selector block at the previous stage is input to the selector block BLF at the final stage, voltage selection is performed thereon, and the D/A-converted voltage VDQ is output.

The plurality of voltages V1 to Vj from the voltage generation circuit 32 are input to the first selector block BLA. Then, the final selector block BLF outputs the D/A-converted voltage VDQ. Specifically, the voltage selection circuit 40 performs voltage selection in the so-called tournament using the selector blocks BLA to BLF, and outputs the final D/A-converted voltage VDQ. The tournament is a voltage selection procedure in which voltage selection is performed by the respective selectors of the selector block based on the control signals, one voltage is selected from the plurality of voltages input to the selector, and thereby, the voltages of the blocks corresponding to the selectors are sequentially selected in elimination tournament.

Each of the plurality of stages of selector blocks BLA to BLF includes a plurality of transistors (e.g. P-type transistors and N-type transistors). Specifically, each of the selector blocks BLA to BLF has one or more selectors and the selector includes a plurality of transistors.

Further, in the embodiment, of the plurality of transistors forming the selector block (at least the final selector block), the second transistor on the far side from the power source node (VDDA, VSS) is set to a lower threshold voltage than that of the first transistor on the near side from the power source node. Specifically, of the plurality of transistors forming the selector block (BLA to BLF), the second P-type transistor on the far side from the high-voltage-side power source node (VDDA) is set to a lower threshold voltage than that of the first P-type transistor on the near side from the high-voltage-side power source node. Further, the second N-type transistor on the far side from the low-voltage-side power source node (VSS) is set to a lower threshold voltage than the threshold voltage of the first N-type transistor on the near side from the low-voltage-side power source node.

Here, the transistor on the far side from the power source node refers to a transistor having an input voltage (input voltage range) farther from the power source voltage (more different from the power source voltage) than the transistor on the near side from the power source node. Let the input voltage of the first transistor on the near side from the power source node be VIN1, the second transistor on the far side from the power source node be VIN2, and the power source voltage be VPWR, for example, |VPWP−VIN2|>|VPWR−VIN1| holds.

Specifically, letting the input voltage of the first P-type transistor on the near side from the high-potential-side power source node be VINP1, the input voltage of the second P-type transistor on the far side from the high-potential-side power source node be VINP2, and the high-potential-side power source voltage be VDDA, for example, VDDA−VINP2>VDDA−VINP1 holds. Letting the input voltage of the first N-type transistor on the near side from the low-potential-side power source node be VINN1, the input voltage of the second N-type transistor on the far side from the low-potential-side power source node be VINN2, and the low-potential-side power source voltage be VSS, for example, VINN2−VSS>VINN1−VSS holds. Note that, in the embodiment, for simplification of explanation, VDDA, VSS are used as signs representing the power sources or signs representing the power source voltages as appropriate.

For example, the selector block BLA in FIG. 1 may include a first selector to which voltages V1, V2 are input and from which one of V1, V2 is output, and a second selector to which voltages V3, V4 are input and from which one of V3, V4 is output. In this case, the transistor (N-type) forming the second selector (V3, V4) is the transistor farther from the node of the low-potential-side power source VSS than the transistor (N-type) forming the first selector (V1, V2).

Further, the selector block BLA may include a third selector to which voltages Vj−2, Vj−3 are input and from which one of Vj−2, Vj−3 is output, and a fourth selector to which voltages Vj, Vj−1 are input and from which one of Vj, Vj−1 is output. In this case, the transistor (P-type) forming the third selector (Vj−2, Vj−3) is the transistor farther from the node of the high-potential-side power source VDDA than the transistor (P-type) forming the fourth selector (Vj, Vj−1).

Figure 2:
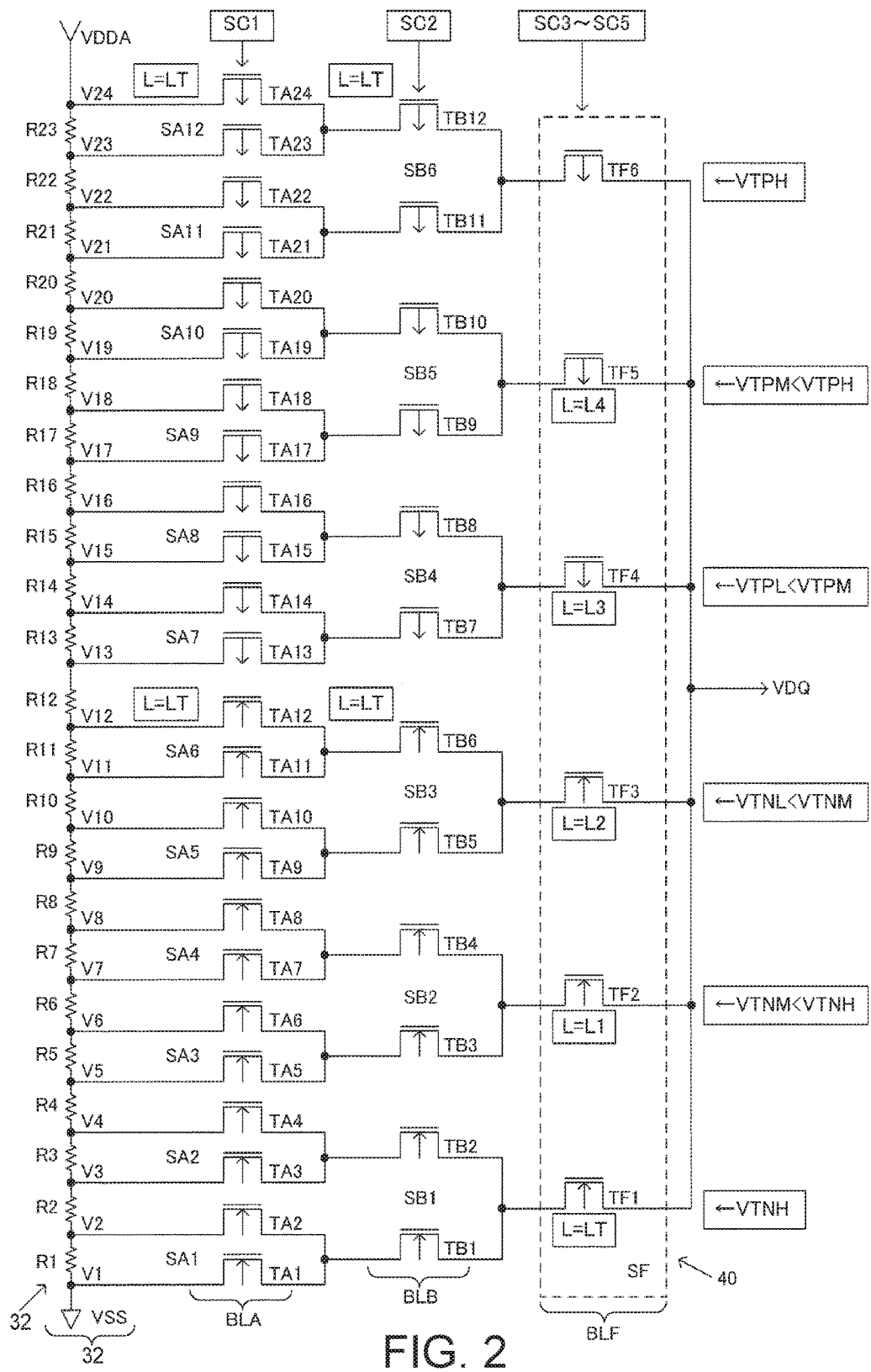
FIG. 2 shows a configuration example of a voltage selection circuit and a voltage generation circuit.

FIG. 2 shows a detailed configuration example of the voltage selection circuit 40 and the voltage generation circuit 32. Note that the configurations of the voltage selection circuit 40 and the voltage generation circuit 32 are not limited to the configurations in FIG. 2, but various modifications such that part of the component elements is omitted and another component element is added may be made. For example, FIG. 2 shows the example in which the voltage generation circuit 32 generates 24 voltages V1 to V24 and these voltages V1 to V24 are input to the voltage selection circuit 40, however, the numbers of the generated and input voltages are not limited to those. Further, FIG. 2 shows the example in which the selectors forming the first selector block BLA are 2-input/1-output selectors, however, for example, selectors having other configurations such as 4-input/1-output selectors may be employed. The same applies to the second and the final selector blocks BLB, BLF. Furthermore, FIG. 2 shows the case where the number of stages of selector blocks is three, however, the number of stages of selector blocks may be four or more. The voltage generation circuit 32 may generate the plurality of voltages using another technique than resistance division.

In FIG. 2, the voltage generation circuit 32 has a plurality of resistors R1 to R23 series-connected between the node of the high-potential-side power source VDDA and the node of the low-potential-side power source VSS (GND). The voltage generation circuit 32 generates the plurality of voltages V1 to V24 by voltage division using these resistors R1 to R23.

The voltage selection circuit 40 includes the selector blocks BLA, BLB, BLF. The BLA, BLB, BLF are the selector blocks at the first stage (initial stage), the second stage, and the final stage, respectively.

The selector block BLA at the first stage includes selectors SA1 to SA12. Each of the selectors SA1 to SA12 is a 2-input/1-output selector and includes two transistors.

Specifically, each of the selectors SA1 to SA6 includes two N-type transistors. For example, the selector SA1 includes N-type transistors TA1, TA2, and the selector SA2 includes N-type transistors TA3, TA4. The same applies to the other selectors SA3 to SA6. On the other hand, each of the selectors SA7 to SA12 includes two P-type transistors. For example, the selector SA7 includes P-type transistors TA13, TA14, and the selector SA8 includes P-type transistors TA15, TA16. The same applies to the other selectors SA9 to SA12.

The plurality of voltages V1 to V24 from the voltage generation circuit 32 are input to the selector block BLA at the first stage. Specifically, the voltages V1, V2 are input to the selector SA1, and the selector selects and outputs one of V1, V2 to the subsequent selector block BLB (selector SB1). The voltages V3, V4 are input to the selector SA2, and the selector selects and outputs one of V3, V4 to the subsequent selector block BLB (selector SB2). The same applies to the other selectors SA3 to SA12.

The selector block BLB at the second stage includes selectors SB1 to SB6. Each of the selectors SB1 to SB6 is a 2-input/1-output selector and includes two transistors. Specifically, each of the selectors SB1 to SB3 includes two N-type transistors. For example, the selector SB1 includes N-type transistors TB1, TB2. The same applies to the other selectors SB2, SB3. On the other hand, each of the selectors SB4 to SB6 includes two P-type transistors. For example, the selector SB4 includes P-type transistors TB7, TB8. The same applies to the other selectors SB5, SB6.

The plurality of voltages selected by the selector block BLA at the first (previous) stage are input to the second selector block BLB. Specifically, the two voltages selected by the selectors SA1, SA2 at the previous stage are input to the selector SB1, and the selector selects and outputs one of the two voltages to a selector SF of the subsequent (final) selector block BLF. The two voltages selected by the selectors SA3, SA4 at the previous stage are input to a selector SB2, and the selector selects and outputs one of the two voltages to the selector SF of the subsequent selector block BLF. The same applies to the other selectors SB3 to SB6.

The final selector block BLF includes the 6-input/1-output selector SF. The selector SF includes N-type transistors TF1 to TF3 and P-type transistors TF4 to TF6. The six voltages selected by the selectors SB1 to SB6 of the previous selector block BLB are input to the selector SF, and the selector selects and outputs one of the six voltages as the D/A-converted voltage VDQ.

The transistors TA1 to TA24 forming the first selector block BLA are on/off-controlled by the one-bit control signal SC1 (switch control signal) from the decoder 30 in FIG. 1. The control signal SC1 is a signal corresponding to the lower one bit of the input data. For example, if the control signal SC1 is at the L-level (logic level "0"), the odd-numbered transistors TA1, TA3, TA5 . . . TA23 are turned on. On the other hand, if the control signal SC1 is at the H-level (logic level "1"), the even-numbered transistors TA2, TA4, TA6 . . . TA24 are turned on. In other words, the odd-numbered transistors and the even-numbered transistors are turned on or off exclusively to each other. The exclusive on and off may be realized using the control signal SC1 and the inversion signal thereof.

The transistors TB1 to TB12 forming the second selector block BLB are on/off-controlled by the one-bit control signal SC2 from the decoder 30. For example, if the control signal SC2 is at the L-level (logic level "0"), the odd-numbered transistors TB1, TB3 . . . TB11 are turned on. On the other hand, if the control signal SC2 is at the H-level (logic level "1"), the even-numbered transistors TB2, TB4 . . . TB12 are turned on. In other words, the odd-numbered transistors and the even-numbered transistors are turned on or off exclusively to each other. The exclusive on and off may be realized using the control signal SC2 and the inversion signal thereof.

The transistors TF1 to TF6 forming the final selector block BLF are on/off-controlled by e.g. the three-bit control signals SC3 to SC5 from the decoder 30. For example, according to the control signals SC3 to SC5, one of the six transistors TF1 to TF6 is turned on and the other transistors are turned off. Thereby, the 6-input/1-output selector SF is realized.

As described above, in the embodiment, in the plurality of stages of selector blocks BLA, BLB, BLF, the output of the selector of the previous selector block is input to the selector of the subsequent selector block. The output of the selectors SA1 to SA12 of the first (previous) selector block BLA is input to the selectors SB1 to SB6 of the second (subsequent) selector block BLB. The output of the selectors SB1 to SB6 of the second (previous) selector block BLB is input to the selector SF of the final subsequent) selector block BLF. The plurality of voltages V1 to V24 are input to the first selector block BLA, voltage selection is performed in the so-called tournament, and the D/A-converted voltage VDQ of the input data DI is output from the final selector block BLF.

Each of the plurality of stages of selector blocks BLA, BLB, BLF includes the plurality of transistors. For example, the selector block BLA includes the transistors TA1 to TA24. The selector block BLB includes the transistors TB1 to TB12. The selector block BLF includes the transistors TF1 to TF6.

Further, in the pluralities of transistors, the transistors on the far sides from the power source nodes (VDDA, VSS) are set to the lower threshold voltages than the transistors on the near sides from the power source nodes (VDDA, VSS).

For example, in the final block BLF, the P-type transistor TF5 (second transistor) is the transistor farther from the node of the high-potential-side power source VDDA than the P-type transistor TF6 (first transistor). Accordingly, the threshold voltage VTPM of TF5 is set to be the lower voltage than the threshold voltage VTPH of TF6 (VTPM<VTPH). The P-type transistor TF4 (third transistor) is the transistor farther from the node of VDDA than the P-type transistor TF5 (second transistor). Accordingly, the threshold voltage VTPL of TF4 is set to the lower voltage than the threshold voltage VTPM of TF5 (VTPL<VTPM). The same applies to the P-type transistors TA13 to TA24, TB7 to TB12 of the previous selector blocks BLA, BLB. Note that the threshold voltages VTPH, VTPM, VTPL of the P-type transistors refer to absolute values of the threshold voltages (|VTPH|, |VTPM|, |VTPL|).

Further, in the final block BLF, the N-type transistor TF2 (second transistor) is the transistor farther from the node of the low-potential-side power source VSS than the N-type transistor TF1 (first transistor). Accordingly, the threshold voltage VTNM of TF2 is set to the lower voltage than the threshold voltage VTNH of TF1 (VTNM<VTNH). The N-type transistor TF3 (third transistor) is the transistor farther from the node of VSS than the N-type transistor TF2 (second transistor). Accordingly, the threshold voltage VTNL of TF3 is set to the lower voltage than the threshold voltage VTNM of TF2 (VTNL<VTNM). The same applies to the N-type transistors TA1 to TA12, TB1 to TB6 of the previous selector blocks BLA, BLB.

Here, the first transistors (TF1, TF6, etc.) on the near sides of the power source nodes (VDDA, VSS) are first kind (PRH, which will be described later) of transistors having a first threshold voltage (e.g. 0.6 V) as a typical value of the threshold voltage. The second transistors (TF2, TF5, etc.) on the far sides of the power source nodes are second kind (PRM, which will be described later) of transistors having a second threshold voltage (e.g. 0.45 V) lower than the first threshold voltage as a typical value of the threshold voltage. The third transistors (TF3, TF4, etc.) on the farther sides of the power source nodes are third kind (PRL, which will be described later) of transistors having a third threshold voltage (e.g. 0.25 V) lower than the second threshold voltage as a typical value of the threshold voltage.

The typical value of the threshold voltage is the threshold voltage when the manufacturing process condition is a typical condition (a condition without process fluctuations) and the temperature is a reference temperature (e.g. 25° C.), for example. The first, second, third kinds of transistors are e.g. transistors in different manufacturing processes. The first kind of transistors (TF1, TF6, etc.) are e.g. transistors formed in a manufacturing process for high withstand voltage. The third kind of transistors (TF3, TF4, etc.) are e.g. transistors formed in a manufacturing process for low withstand voltage. The second kind of transistors (TF2, TF5, etc.) are e.g. transistors formed in a manufacturing process for medium withstand voltage between the high withstand voltage and the low withstand voltage.

For example, the first, second transistors as the first, second kinds of transistors are set to the different threshold voltages because the manufacturing process parameters of the transistors are different. The third transistors as the third kind of transistors are set to the threshold voltages different from the threshold voltages of the first, second transistors because the manufacturing process parameters of the transistors are different. Here, the manufacturing process parameters are parameters of impurity concentrations in channel regions or the like, thicknesses of gate oxide films, etc. of the transistors. For example, the threshold voltages of the transistors are set by increasing and decreasing the impurity concentrations. Or, the threshold voltages of the transistors are set by increasing and decreasing the thicknesses of the gate oxide films. Or, the manufacturing process parameter may be a parameter with respect to heteropolar gates. That is, the threshold voltages of the transistors are set by using different kinds of gates (e.g. gates having different concentrations and types of ion-implanted impurities) with respect to the gates (polysilicon) of the transistors. As described above, various parameters may be assumed as the manufacturing process parameters for setting the threshold voltages of the transistors.

Further, in the embodiment, the threshold voltages of the transistors are differentiated not only by the kinds of transistors (manufacturing processes or the like) but also by the gate lengths L (channel lengths) of the transistors. Specifically, as will be described later, the threshold voltages of the transistors are set by effective utilization of the short channel effect and the reverse short channel effect of the transistors.

For example, in FIG. 2, the first transistors (TF1, TF6, etc.) and the second transistors (TF2, TF5, etc.) are different in gate length (channel length). Further, regarding the third transistors (TF3, TF4, etc.), the gate lengths may be differentiated from those of the other transistors. In other words, at least one transistor of the first, second, third transistors has a different gate length from those of the other transistors of the first, second, third transistors.

For example, the gate lengths of the transistors TF1, TF6 (first transistors) are set to L=LT. Here, LT is a standard gate length (typical gate length) in the first kind of transistors (PRH) e.g. LT=0.4 μm.

On the other hand, the gate lengths of the transistors TF2, TF5 (second transistors) are set to L=L1, L4, and L1, L4 are different from the standard gate length LT. For example, L1, L4 are made longer or shorter than LT. Note that L1 or L4 may be set to be equal to LT. Further, L1 and L4 may be different or the same.

The gate lengths of the transistors TF3, TF4 (third transistors) are set to L=L2, L3, and L2, L3 are different from the standard gate length LT. For example, L2, L3 are made longer or shorter than LT. Note that L2 or L3 may be set to be equal to LT. Further, L2 and L3 may be different or the same. Furthermore, L2, L3 and the above described L1, L4 may be different or the same.

The gate length of at least one transistor forming the final selector block BLF is longer than the gate lengths of the other transistors forming the final selector block BLF. Further, the gate length of at least one transistor forming the final selector block BLF is longer than the gate lengths of the transistors forming the first selector block BLA.

For example, the gate length L3, L4 of the P-type transistor TF4 or TF5 forming the selector block BLF is longer than the gate length LT of the other P-type transistor TF6 forming BLF. Or, the gate length L3, L4 of the P-type transistor TF4 or TF5 is longer than the gate length LT of the P-type transistors TA13 to TA24 forming the first selector block BLA.

Further, the gate length L2 of the N-type transistor TF3 or the like forming the selector block BLF is longer than the gate length LT of the other N-type transistor TF1 forming the selector block BLF. Or, the gate length L2 of the N-type transistor TF3 or the like is longer than the gate length LT of the N-type transistors TA1 to TA12 forming the first selector block BLA.

As described above, the threshold voltages of the transistors are set using not only the kinds of transistors but also the gate lengths, and accordingly, the finer adjustment of the threshold voltages can be performed. Thereby, even in the case where the power source voltage is low or the like, the setting of the threshold voltages that satisfy the on conditions and off conditions of the transistors is easier. Further, the setting of the threshold voltages that suppress non-linearity errors (DNL or the like) of the D/A converter due to an off-leakage current of the transistors (leakage current when the transistors are off) can be made.

Note that, as shown in FIG. 2, in the embodiment, the selector SF of the final selector block BLF is the selector to which e.g. six voltages (I voltages in a broad sense, I≥3) are input from the previous selector block BLB and from which one D/A-converted voltage VDQ is output. That is, the final selector block BLF performs voltage selection from e.g. six voltages (three or more voltages in a broad sense) using, e.g., one selector SF and outputs the D/A-converted voltage VDQ. As will be described later, in the transistors TF1 to TF6 of the final selector block BLF, the input voltages vary in a given voltage range. Accordingly, there is a problem in difficulty of setting of the threshold voltages that satisfy the on conditions and off conditions of the transistors or the like. In this regard, in FIG. 2, the selector SF of the selector block BLF is the 6-input/1-output selector, not a 2-input/1-output selector. Therefore, compared to the case of the 2-input/1-output selector, the input voltage range (voltage variation range) of the transistors TF1 to TF6 forming the selector SF may be made narrower. As a result, there is an advantage that the setting of the threshold voltages that satisfy the on conditions and off conditions of the transistors or the like may be made easier.

2. Technique of Setting Threshold Voltages

Next, a technique of setting the threshold voltages of the embodiment will be explained in detail. FIG. 3A is an explanatory diagram of an on condition and an off condition of a P-type transistor TP. As shown in FIG. 3A, when the P-type transistor TP is turned on, VSS=0 V is input to the gate thereof, for example. To turn on the P-type transistor TP, it is necessary to make a voltage between gate and source (absolute value) larger than a threshold voltage (absolute value) and fulfill an on condition shown by the following expression (1).

$$VIN > VTP + VBS + VPR + VTS \qquad (1)$$

Here, VIN is an input voltage of the P-type transistor TP (input voltage between source and drain). VTP is a basic threshold voltage of the P-type transistor TP, and VBS is an increase of the threshold voltage due to the substrate bias effect. That is, in the P-type transistor TP, the substrate voltage is e.g. a voltage of VDDA and different from the input voltage VIN, and the threshold voltage VTP increases by the voltage VBS due to the substrate bias effect. Further, VPR is a fluctuation portion (a fluctuation portion in the positive direction) of the threshold voltage due to process fluctuations. VTS is a fluctuation portion (a fluctuation portion in the positive direction) of the threshold voltage due to temperature fluctuations. That is, there are fluctuations in the manufacturing process of semiconductors, and the threshold voltage may be higher due to the fluctuations. When there are temperature fluctuations, the threshold voltage may fluctuate and become higher. Therefore, to turn on the P-type transistor TP, it is necessary that the input voltage VIN is higher than VTP+VBS+VPR+VTS. Note that VTP refers to an absolute value of the threshold voltage |VTP|).

To properly turn off the P-type transistor TP, it is necessary to fulfill an off condition shown by the following expression (2).

$$VTP - VPR - VTS > 0 \qquad (2)$$

Here, VPR is a fluctuation portion (a fluctuation portion in the negative direction) of the threshold voltage due to process fluctuations. VTS is a fluctuation portion (a fluctuation portion in the negative direction) of the threshold voltage due to temperature fluctuations. That is, there are fluctuations in the manufacturing process of semiconductors, and the threshold voltage may be lower due to the fluctuations. When there are temperature fluctuations, the threshold voltage may fluctuate and become lower. To properly turn off the P-type transistor TP even when the threshold voltage fluctuates due to process fluctuations and temperature fluctuations, it is necessary to fulfill the off condition shown by the above expression (2).

FIG. 3B is an explanatory diagram of an on condition and an off condition of an N-type transistor TN. As shown in FIG. 3B, when the N-type transistor TN is turned on, a voltage of VDDA (e.g. 0.9 V) is input to the gate thereof, for example. To turn on the N-type transistor TN, it is necessary to make a voltage between gate and source (VDDA−VIN) larger than a threshold voltage and fulfill an on condition shown by the following expression (3).

$$VDDA-VIN>VTN+VBS+VPR+VTS \qquad (3)$$

Here, VTN is a basic threshold voltage of the N-type transistor TN, and VBS is an increase of the threshold voltage due to the substrate bias effect. VPR, VTS are fluctuation portions (fluctuation portions in the positive direction) of the threshold voltage due to process fluctuations and temperature fluctuations like those as described above.

To properly turn off the N-type transistor TN, it is necessary to fulfill an off condition shown by the following expression (4).

$$VTN-VPR-VTS>0 \qquad (4)$$

VPR, VTS are fluctuation portions (fluctuation portions in the negative direction) of the threshold voltage due to process fluctuations and temperature fluctuations like those as described above.

Now, if the voltage of the power source VDDA is sufficiently higher than the threshold voltages of the transistors, in the D/A converter having the configuration as shown in FIGS. 1 and 2, there is little need to consider the on conditions and the off conditions shown by the above expressions (1) to (4).

However, it has been turned out that, if the voltage of the power source VDDA is lower and closer to the threshold voltages of the transistors, it is impossible to realize the proper operation of the D/A converter having the configuration as shown in FIGS. 1 and 2 without consideration of the on conditions and the off conditions shown by the above expressions (1) to (4).

For example, in the embodiment, as will be described later, the power source VDDA is generated by a power source circuit using a work function difference between the transistors. Accordingly, the voltage of VDDA becomes a very low voltage e.g. 0.9 V. Further, if the voltage becomes the low voltage VDDA=0.9 V, the proper voltage selection is difficult in the voltage selection circuit 40 in which many transistors are arranged between the power sources as shown in FIG. 2. In other words, if the voltage of the power source VDDA is lower, it is difficult to satisfy the on conditions and the off conditions of the transistors forming the voltage selection circuit 40 and it is difficult to output the D/A-converted voltage VDQ by proper voltage selection in the tournament.

For example, FIG. 4A shows input voltage ranges VR (voltage ranges of input voltages VIN) of the P-type transistors TF4 to TF6 at the final stage in FIG. 2. For example, if VDDA=0.9 V, the input voltage range of the P-type transistor TF6 at the final stage is VR=0.9 to 0.75 V. That is, to the P-type transistor TF6, one voltage of the voltages V24, V23, V22, V21 generated by the voltage generation circuit 32 is input as the input voltage VIN. Therefore, the input voltage range of the transistor TF6 is the range of VR=0.9 to 0.75 V corresponding to the voltages V24 to V21.

Further, to the P-type transistor TF5, one voltage of the voltages V20, V19, V18, V17 generated by the voltage generation circuit 32 is input as the input voltage VIN. Therefore, the input voltage range of the transistor TF5 is a range of VR=0.75 to 0.6 V corresponding to the voltages V20 to V17. Similarly, the input voltage range of the P-type transistor TF4 is a range of VR=0.6 to 0.45 V.

FIG. 4B shows input voltage ranges VR of the N-type transistors TF1 to TF3 in FIG. 2. For example, to the N-type transistor TF3, one voltage of the voltages V12, V11, V10, V9 is input as the input voltage VIN. Therefore, the input voltage range of the transistor TF3 is a range of VR=0.45 to 0.3 V corresponding to the voltages V12 to V9. Similarly, the input voltage ranges of the N-type transistors TF2, TF1 are ranges of VR=0.3 to 0.15 V, VR=0.15 to 0 V, respectively.

In FIG. 4A, the input voltage range of the P-type transistor TF6 is VR=0.9 to 0.75 V, and the minimum voltage VINmin of the input voltage VIN in the input voltage range is 0.75 V. As shown in FIG. 3A, the on condition of the P-type transistor TF6 is VIN>VTP+VBS+VPR+VTS. Therefore, when VINmin=0.75 V, the margin expressed by VIN−(VTP+VBS+VPR+VTS) becomes the minimum and the on condition of the transistor TF6 is the strictest. Similarly, in the transistors TF5, TF4, when VINmin=0.6 V, 0.45 V, the on conditions are the strictest, respectively.

Further, in FIG. 4B, the input voltage range of the N-type transistor TF3 is VR=0.45 to 0.3 V, and the minimum voltage (VDDA−VIN)min of VDDA−VIN in the input voltage range is 0.45 V. That is, VDDA=0.9 V and, for VIN=0.45 V, VDDA−VIN becomes the (VDDA−VIN)min=0.9 V−0.45 V=0.45 V. As shown in FIG. 3B, the on condition of the N-type transistor TF3 is VDDA−VIN>VTN+VBS+VPR+VTS. Therefore, when (VDDA−VIN)min=0.45 V, the margin expressed by (VDDA−VIN)−(VTN+VBS+VPR+VTS) becomes the minimum and the on condition of the transistor TF3 is the strictest. Similarly, in the transistors TF2, TF1, when (VDDA−VIN)min=0.6 V, 0.75 V, the on conditions are the strictest, respectively.

As described above, in the P-type transistors TF6, TF5, TF4 in FIG. 4A, it is necessary to set the threshold voltages VTP so that the on conditions of VIN>VTP+VBS+VPR+VTS may be satisfied for VINmin=0.75 V, 0.6 V, 0.45 V at which the on conditions are the strictest. Therefore, it is necessary to set the the threshold voltages VTP of the transistors TF6, TF5, TF4 at least to be lower than 0.75 V, 0.6 V, 0.45 V, respectively.

Further, in the N-type transistors TF3, TF2, TF1 in FIG. 4B, it is necessary to set the threshold voltages VTN so that the on conditions of VDDA−VIN>VTN+VBS+VPR+VTS may be satisfied for (VDDA−VIN)min=0.45 V, 0.6 V, 0.75 V at which the on conditions are the strictest. Therefore, it is necessary to set the the threshold voltages VTN of the transistors TF3, TF2, TF1 at least to be lower than 0.45 V, 0.6 V, 0.75 V, respectively.

As shown in FIG. 4A, for example, in the P-type transistors of the kinds PRH, PRM, PRL, the typical values of the threshold voltages are 0.6 V, 0.45 V, 0.25 V, respectively. Further, as shown in FIG. 4B, in the N-type transistors of the kinds PRL, PRM, PRH, the typical values of the threshold voltages are 0.25 V, 0.45 V, 0.6 V, respectively. In other words, the threshold voltages (absolute values) are the highest for the kind PRH and the lowest for the kind PRL.

Accordingly, when the technique of setting the threshold voltages according to the settings of the kinds of transistors is employed, for example, it is desirable to use the transistor of the kind PRH for TF6, the transistor of the kind PRM for TF5, and the transistor of the kind PRL for TF4. Further, it is desirable to use the transistor of the kind PRL for TF3, the transistor of the kind PRM for TF2, and the transistor of the kind PRH for TF1. In this manner, at least the on conditions of the transistors can be satisfied.

On the other hand, if the threshold voltages VTP, VTN become too low, in this case, a problem that the off conditions in FIGS. 3A and 3B are not satisfied occurs. In other words, if the threshold voltages VTP, VTN become too low, the off conditions VTP−VPR−VTS>0, VTN−VPR−VTS>0 may not hold. Further, it is also necessary to consider a problem that the non-linearity error (DNL) of the D/A converter due to the off-leakage current of the transistors exceeds an acceptable value. Accordingly, it is desirable to set the threshold voltages VTP of the transistors TF6, TF5, TF4 to be lower than 0.75 V, 0.6 V, 0.45 V, and closer to the voltages, respectively. Further, it is desirable to set the threshold voltages VTN of the transistors TF3, TF2, TF1 to be lower than 0.45 V, 0.6 V, 0.75 V, and closer to the voltages, respectively.

Figure 5:
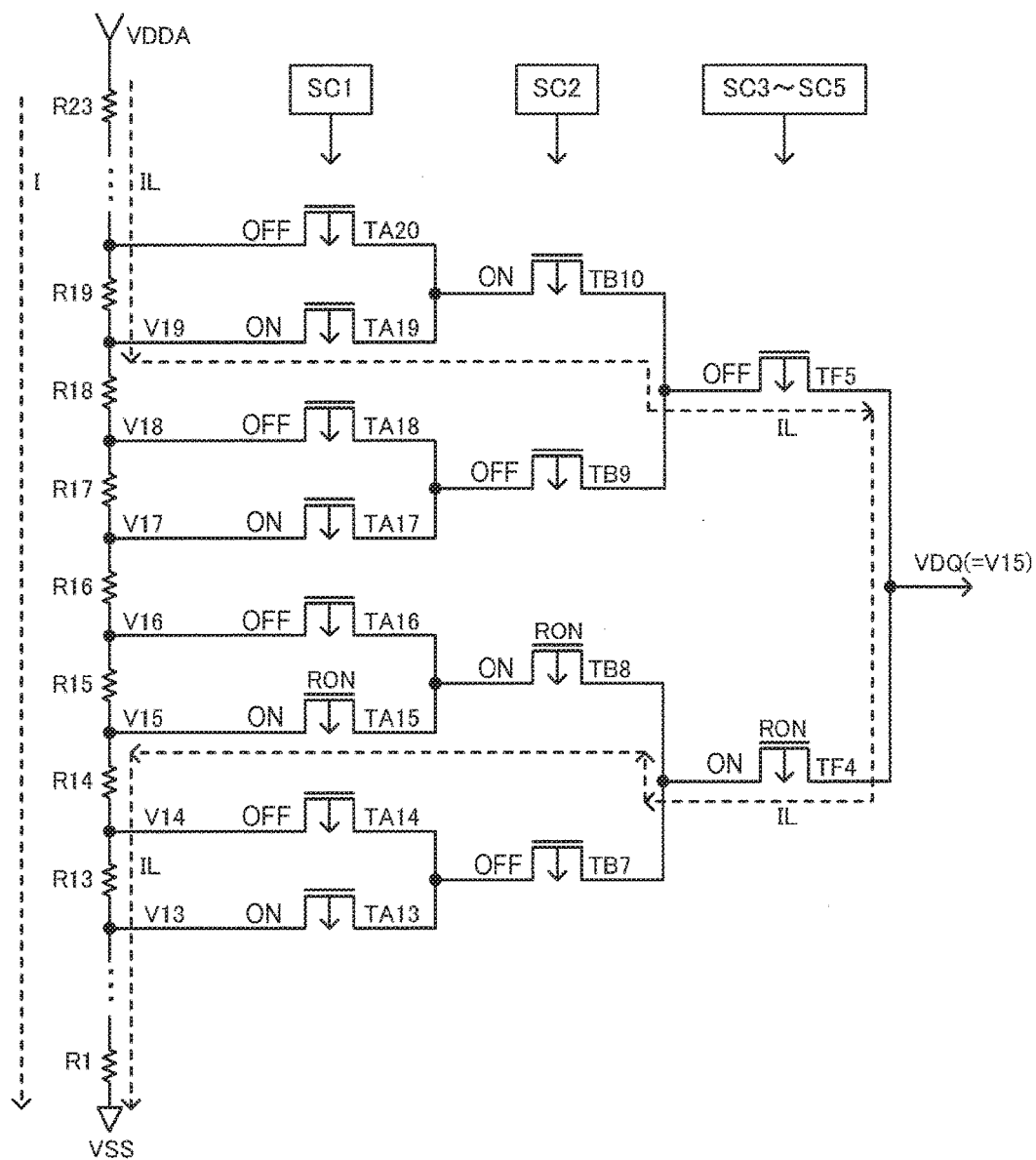
FIG. 5 is an explanatory diagram of a problem occurring due to an off-leakage current.

FIG. 5 is an explanatory diagram of a problem caused by an off-leakage current of the transistors. The transistors TA13 to TA20 at the first stage are exclusively turned on or off according to the control signal SC1. For example, in FIG. 5, the odd-numbered transistors TA13, TA15 . . . TA19 are on and the even-numbered transistors TA14, TA16 . . . TA20 are off. Further, the transistors TB7 to TB10 at the second stage are exclusively turned on or off according to the control signal SC2. For example, in FIG. 5, the odd-numbered transistors TB7, TB9 are off and the even-numbered transistors TB8, TB10 are on. Furthermore, regarding the transistors TF4, TF5 at the final stage, TF4 is on and TF5 is off. Thereby, in FIG. 5, the voltage V15 is selected and the D/A-converted voltage VDQ=V15 is output.

In this case, for example, an off-leakage current IL flows even in the transistor TF5 being off. The off-leakage current IL flows in the transistor TF5 in the off state from the power source VDDA via the resistors R23 to R19 and the transistors TA19, TB10 in the on state and flows into the transistor TF4 in the on state. Then, the off-leakage current IL flows into the node of the voltage V15 via the transistors TB8, TA15 in the on state and flows to the power source VSS side via the resistors R14 to R1.

When the off-leakage current IL flows, the D/A-converted voltage VDQ shifts from the voltage V15 by an amount of a voltage corresponding to a product of the on resistors RON of the transistor TF4, TB8, TA15 in the on state and the off-leakage current. Originally, it is assumed that a current I corresponding to that obtained by division of the voltage of VDDA−VSS by the total resistance value of the resistors R1 to R23 flows in the series-connected resistors R1 to R23, however, when the off-leakage current IL flows, the assumption is undermined. That is, in the voltage generation circuit 32, there is an assumption that the current I flows from the power source VDDA to VSS and the voltages V1 to V24 obtained by equal division of the voltage of VDDA−VSS are generated. However, when the off-leakage current IL exists, for example, such a situation that the current flowing in the resistors R23 to R19 or R14 to R1 becomes I+IL is caused and the above described assumption is undermined and the D/A-converted voltage VDQ shifts from the voltage V15.

Then, if the D/A-converted voltage VDQ shifts from the original voltage and the non-linearity error (DNL) of the D/A converter exceeds an acceptable value (e.g. a voltage of 1 LSB), it may be impossible to realize proper D/A conversion.

To avoid the problem of the off-leakage current as shown in FIG. 5 while satisfying the on conditions and the off conditions of the transistors, the setting technique of the threshold voltages by the setting of the kinds of transistors explained in FIGS. 4A and 4B may be insufficient.

For example, in FIG. 5, to reduce the current value of the off-leakage current IL, it is necessary to make the threshold voltage of the transistor TF5 in the off state higher. The threshold voltage of the transistor TF5 is made higher, and thereby, the off-leakage current IL is reduced and the non-linearity error due to the off-leakage current IL can be reduced.

However, for example, if the threshold voltage of the transistor TF4 in the on state is also made higher, in this case, the on resistor RON increases and noise due to the on resistor RON increases. If the noise increases, for example, in the case where the D/A converter is used for the circuit device for oscillator, which will be described later, a problem of increase in phase noise of the oscillation frequency occurs.

To satisfy various conditions including the on conditions, the off conditions, and avoidance conditions of performance degradation (non-linearity error increase) due to the off-leakage current of the transistors, fine adjustment of the threshold voltages is necessary.

However, in the setting technique of the threshold voltages by the setting of the kinds of transistors explained in FIGS. 4A and 4B, coarse adjustment of the threshold voltages can be made, but the fine adjustment is difficult. For example, a technique of realizing fine adjustment of the threshold voltages by increasing the kinds of transistors (manufacturing processes) is considered, however, in the technique, a problem of increase in cost, increase and complication of effort and work, etc. due to the increase of the kinds of manufacturing processes is caused.

Accordingly, in the embodiment, in addition to the setting of the threshold voltages by the setting of the kinds of transistors as shown in FIGS. 4A and 4B, setting of the threshold voltages by adjustment of gate lengths (channel lengths) of the transistors is made. For example, coarse adjustment of the threshold voltages is performed by the setting of the kinds of transistors and fine adjustment of threshold voltages is performed by the adjustment of the gate lengths of the transistors. In this manner, the setting technique of the threshold voltages that can satisfy the on conditions, the off conditions, and the avoidance conditions of performance degradation due to the off-leakage current of the transistors may be realized.

Figure 6A:
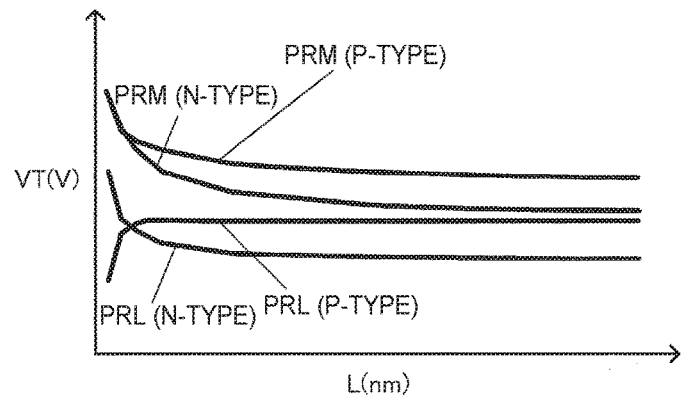
FIGS. 6A to 6D are explanatory diagrams of a technique of adjusting the threshold voltages by gate lengths.
Figure 6B:
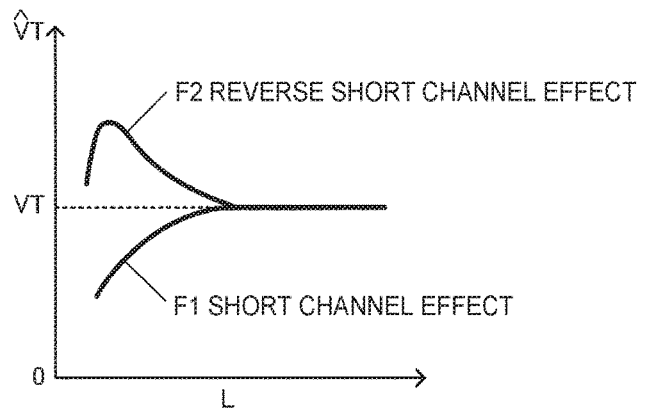

For example, FIG. 6A shows an example of relationships between the gate length L and the threshold voltage VT in the P-type, N-type transistors of the kinds PRM, PRL. For example, in the P-type transistor of the kind PRL (low withstand voltage), when a channel value L becomes longer due to a short channel effect shown by F1 in FIG. 6B, the threshold voltage VT tends to increase. On the other hand, in the P-type transistor, N-type transistor of the kind PRM (medium withstand voltage) and the N-type transistor of the kind PRL (low withstand voltage), when the gate length becomes longer due to a reverse short channel effect shown by F2 in FIG. 6B (in the long channel region), the threshold voltage VT tends to decrease.

Figure 6C:
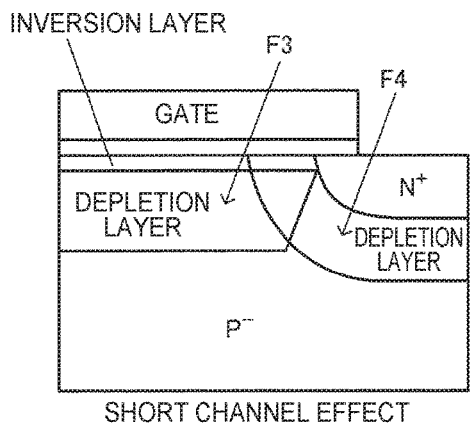
Figure 6D:
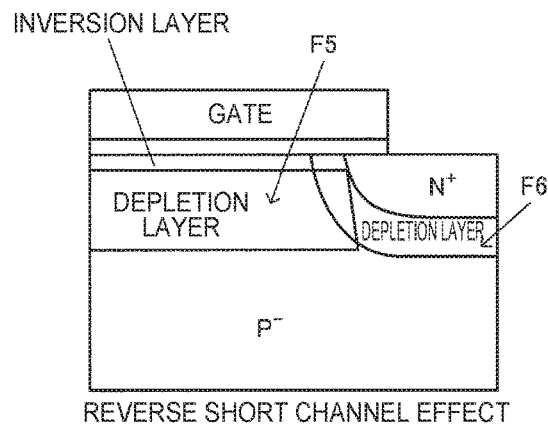

For example, F3, F4 in FIG. 6C schematically show depletion layers in the case of the short channel effect. F3 is the depletion layer by the gate and F4 is the depletion layer by the source and drain (N-type impurity region). The decrease of the threshold voltage due to the short channel effect is caused by the influence of the depletion layers of F3, F4. That is, acceptor ions in the depletion layers reduce the surface potential (inversion layer) and the threshold voltage decreases. For example, in FIG. 6C, the depletion layer by the source and drain extends to the channel side and the acceptor ions in this part reduce the surface potential and reduce the threshold voltage. On the other hand, F5, F6 in FIG. 6D schematically show depletion layers in the case of the reverse short channel effect. F5 is the depletion layer by the gate and F6 is the depletion layer by the source and drain. The shape of the depletion layer by the source and drain of F6 in FIG. 6D is different from that of F4 in FIG. 6C, and, for example, the influence of the acceptor ions in the depletion layers is smaller.

In the embodiment, fine adjustment of the threshold voltages using the gate lengths L is realized by taking advantage of these short channel effect and the reverse short channel effect. For example, in the P-type transistor of the kind PRL, the gate length L is made longer, and thereby, the threshold voltage may be increased from the typical value thereof by the short channel effect. On the other hand, in the P-type transistor, N-type transistor of the kind PRM and the N-type transistor of the kind PRL, the gate lengths L are made longer, and thereby, the threshold voltages may be decreased from the typical values thereof by the reverse short channel effect. Thereby, fine adjustment of the threshold voltages for satisfying the on conditions, the off conditions, and the avoidance conditions of performance degradation due to the off-leakage current of the transistors can be performed.

Note that, in the embodiment, the threshold voltages of the transistors may be set using the substrate bias effect. For example, at least one transistor (TF1 to TF6) forming the final selector block BLF is used as a transistor at the controlled substrate voltage, and thereby, fine adjustment of the threshold voltages of these transistors is realized.

Figure 7A:
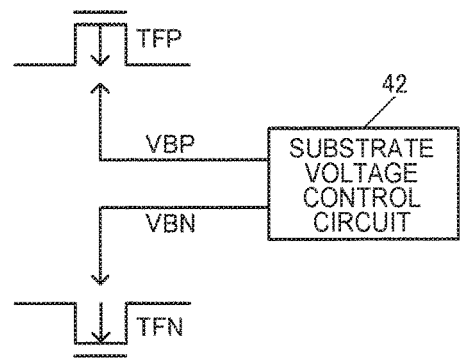
FIGS. 7A to 7C are explanatory diagrams of a technique of adjusting the threshold voltages by control of substrate voltages.

For example, in FIG. 7A, a substrate voltage control circuit 42 is provided in the D/A converter (circuit device), and the substrate voltage control circuit 42 supplies a voltage VBP as a substrate voltage of a P-type transistor TFP. Further, the circuit supplies a voltage VBN as a substrate voltage of an N-type transistor TFN. The P-type transistor TFP is at least one of the P-type transistors TF4 to TF6 forming the final selector block BLF in FIG. 2. The N-type transistor TFN is at least one of the N-type transistors TF1 to TF3 forming the final selector block BLF. That is, normally, the voltage of the high-potential-side power source VDDA (e.g. 0.9 V) is supplied as the substrate voltage of the P-type transistor TFP, however, the substrate voltage control circuit 42 supplies the voltage VBP different from the voltage. Further, normally, the voltage of the low-potential-side power source VSS (e.g. 0 V) is supplied as the substrate voltage of the N-type transistor TFN, however, the substrate voltage control circuit 42 supplies the voltage VBN different from the voltage.

Figure 7B:
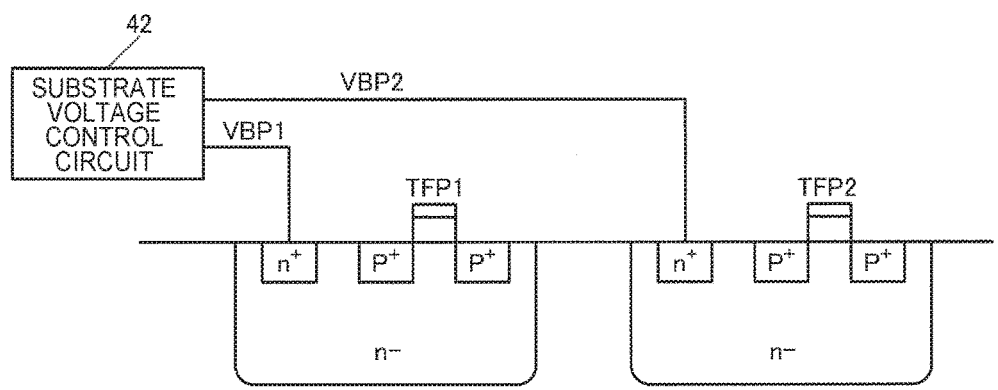

For example, in FIG. 7B, P-type transistors TFP1, TFP2 are provided as the P-type transistors TFP. These P-type transistors TFP1, TFP2 are formed in N-type wells electrically separated from each other. The substrate voltage control circuit 42 supplies a voltage VBP1 as a substrate voltage for setting the potential of the N-type well of the P-type transistor TFP1. Further, the circuit supplies a voltage VBP2 as a substrate voltage for setting the potential of the N-type well of the P-type transistor TFP2. In this manner, the threshold voltages of the P-type transistors TFP1 and TFP2 may be set to different voltages.

Figure 7C:
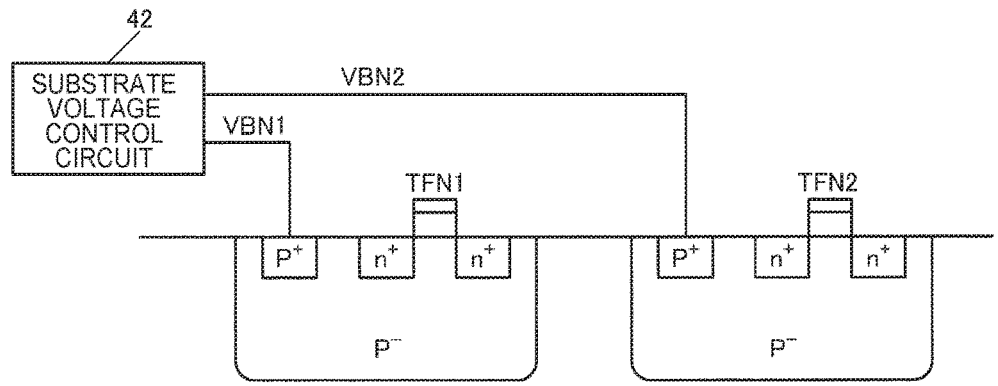

In FIG. 7C, N-type transistors TFN1, TFN2 are provided as the N-type transistors TFN. These N-type transistors TFN1, TFN2 are formed in P-type wells electrically separated from each other. The substrate voltage control circuit 42 supplies a voltage VBN1 as a substrate voltage for setting the potential of the P-type well of the N-type transistor TFN1. Further, the circuit supplies a voltage VBN2 as a substrate voltage for setting the potential of the P-type well of the N-type transistor TFN2. In this manner, the threshold voltages of the N-type transistors TFN1 and TFN2 may be set to different voltages.

As described above, for example, the substrate voltages of the transistors (TF1 to TF6) forming the final selector are controlled, and thereby, the threshold voltages of these transistors may be set. Thereby, fine adjustment of the threshold voltages for satisfying the on conditions, the off conditions, and the avoidance conditions of performance degradation due to the off-leakage current of the transistors can be performed.

Note that, in the technique of controlling the substrate voltages, it is necessary to form the electrically separated wells (P-type, N-type) as shown in FIGS. 7B, 7C, and the layout area of the circuit increases. On the other hand, in the technique of setting the gate lengths L, for example, even when the gate lengths are made longer, the layout area of the circuit increases little. Therefore, in this regard, the technique of setting the gate lengths L is advantageous.

3. Specific Examples of Settings of Threshold Voltages

Figure 8:
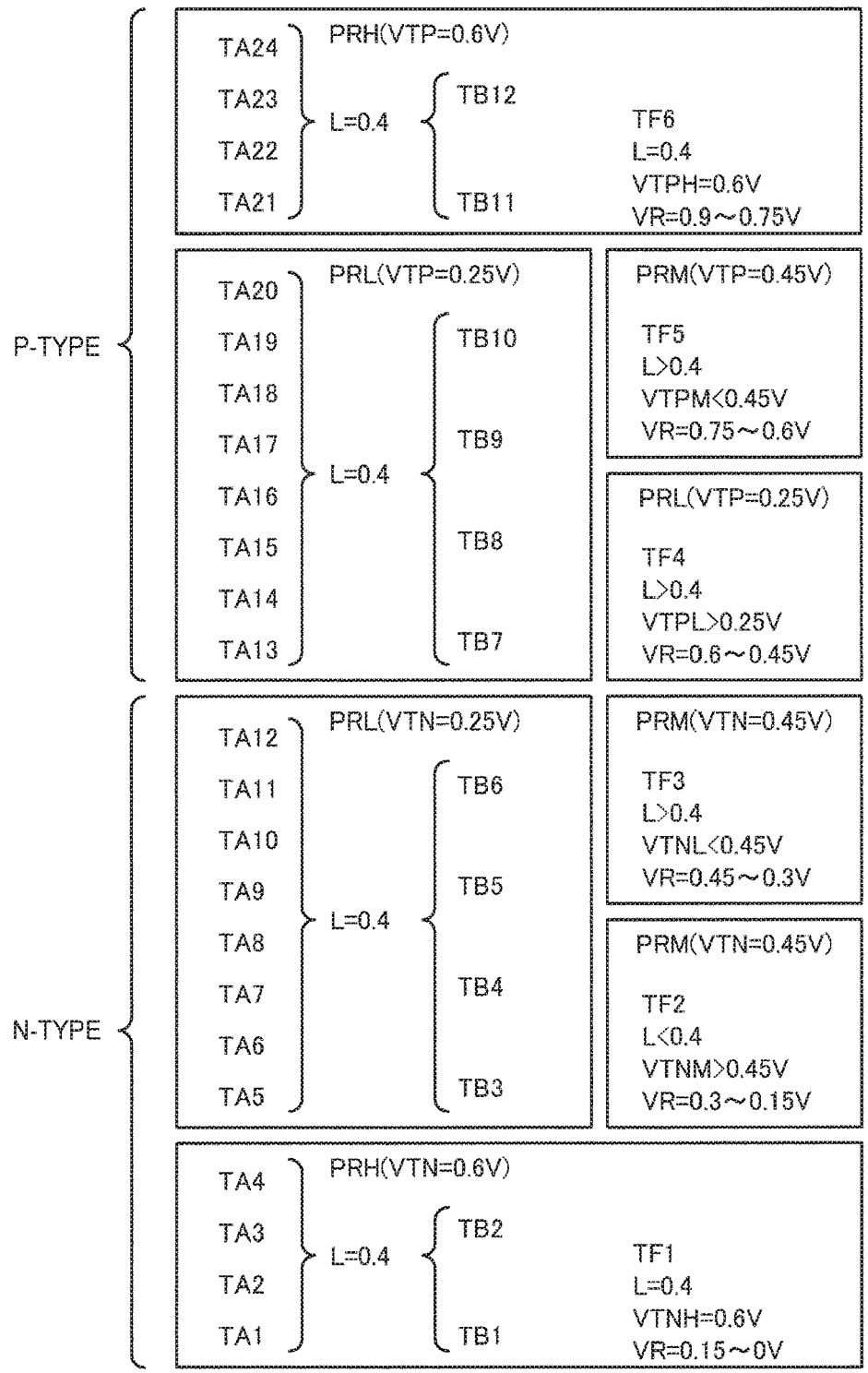
FIG. 8 shows a specific example of settings of the threshold voltages.

FIG. 8 shows a specific example of settings of the threshold voltages. In FIG. 8, P-type transistors of the kind PRH (high withstand voltage) are used as the P-type transistors TA21 to TA24, TB11, TB12, TF6. The gate lengths of these transistors are set to L=0.4 μm. The P-type transistors of the kind PRH have typical values of the threshold voltages at 0.6 V. For example, as explained in FIG. 4A, the input voltage range of the transistor TF6 at the final stage is from 0.9 to 0.75 V and VINmin=0.75 V. Therefore, even when the threshold voltage VTPH of the transistor TF6 is set to 0.6 V as the typical value of the threshold voltage of the kind PRH, the on conditions, off conditions, etc. of the transistors may be satisfied.

Further, in FIG. 8, transistors of the kind PRL (low withstand voltage) are used as the P-type transistors TA13 to TA20, TB7 to TB10. The gate lengths of these transistors are set to L=0.4 μm. The transistors of the kind PRL have typical values of the threshold voltages at 0.25 V.

As described above, in the embodiment, the transistors of the kind PRL having the low threshold voltages are used as the transistors TA13 to TA20, TB7 to TB10 on the far side from the node of the power source VDDA. Thereby, the threshold voltages of these transistors TA13 to TA20, TB7 to TB10 may be set to lower voltages than those of the transistors TA21 to TA24, TB11, TB12 on the near side from the node of the power source VDDA.

In FIG. 8, N-type transistors of the kind PRH (high withstand voltage) are used as the N-type transistors TA1 to TA4, TB1, TB2, TF1. The gate lengths of these transistors are set to L=0.4 μm. The N-type transistors of the kind PRH have typical values of the threshold voltages at 0.6 V. For example, as explained in FIG. 4B, the input voltage range of the transistor TF1 at the final stage is from 0.15 to 0 V and (VDDA−VIN)min=0.75 V. Therefore, even when the threshold voltage VTNH of the transistor TF1 is set to 0.6 V as the typical value of the threshold voltage of the kind PRH, the on conditions, off conditions, etc. of the transistors may be satisfied.

Further, in FIG. 8, N-type transistors of the kind PRL (low withstand voltage) are used as the N-type transistors TA5 to TA12, TB3 to TB6. The gate lengths of these transistors are set to L=0.4 µm. The N-type transistors of the kind PRL have typical values of the threshold voltages at 0.25 V.

As described above, in the embodiment, the transistors of the kind PRL having the low threshold voltages are used as the transistors TA5 to TA12, TB3 to TB6 on the far side from the node of the power source VSS. Thereby, the threshold voltages of these transistors TA5 to TA12, TB3 to TB6 may be set to lower voltages than those of the transistors TA1 to TA4, TB1, TB2 on the nearside from the node of the power source VSS.

In FIG. 8, a transistor of the kind PRM (medium withstand voltage) having a typical value of the threshold voltage at 0.45 V is used as the P-type transistor TF5 at the final stage. The gate length L of the transistor TF5 is longer than 0.4 µm as the standard gate length. As shown in FIG. 6A, regarding the P-type transistor of the kind PRM, the gate length L is made longer, and thereby, the threshold voltage may be lower by the reverse short channel effect. The threshold voltage of the transistor TF5 is set to VTPM<0.45 V using this phenomenon. For example, the gate length L is set to 2 µm or more, and thereby, the threshold voltage VTPM may be a voltage lower by e.g. about 0.05 to 0.1 V from 0.45 V as the typical value. As explained in FIG. 4A, the input voltage range of the transistor TF5 is from 0.75 to 0.6 V and VINmin=0.6 V. Therefore, the threshold voltage of the transistor TF5 is set to VTPM<0.45 V, and thereby, the on condition, the off condition, the avoidance conditions of performance degradation due to the off-leakage current, etc. of the transistor can be satisfied. For example, VINmin=0.6 V>VTPM+VBS+VPR+VTS as the on condition may be satisfied. Further, VTPM−VPR−VTS>0 as the off condition may also be satisfied. The avoidance conditions of performance degradation due to the off-leakage current, etc. may be satisfied by fine adjustment of the threshold voltage by elongation of the gate length L.

Further, in FIG. 8, a transistor of the kind PRL (low withstand voltage) having a typical value of the threshold voltage at 0.25 V is used as the P-type transistor TF4 at the final stage. The gate length L of the transistor TF4 is longer than 0.4 µm as the standard gate length. As shown in FIG. 6A, regarding the P-type transistor of the kind PRL, the gate length L is made longer, and thereby, the threshold voltage may be higher by the short channel effect. The threshold voltage VTPL of the transistor TF4 is set to a voltage slightly higher than 0.25 V as the typical value using this phenomenon. The input voltage range of the transistor TF4 is from 0.6 to 0.45 V and VINmin=0.45 V. Therefore, VINmin=0.45 V>VTPL+VBS+VPR+VTS as the on condition may be satisfied. Further, VTPL−VPR−VTS>0 as the off condition may also be satisfied. The avoidance conditions of performance degradation due to the off-leakage current, etc. may be satisfied by fine adjustment of the threshold voltage by elongation of the gate length L.

In FIG. 8, a transistor of the kind PRM (medium withstand voltage) having a typical value of the threshold voltage at 0.45 V is used as the N-type transistor TF3 at the final stage. The gate length L of the transistor TF3 is longer than 0.4 µm as the standard gate length. As shown in FIG. 6A, regarding the N-type transistor of the kind PRM, the gate length L is made longer, and thereby, the threshold voltage may be lower by the reverse short channel effect. The threshold voltage VTNM of the transistor TF3 is set to a lower voltage than the typical value using this phenomenon. For example, the gate length L is set to 2 µm or more, and thereby, the threshold voltage VTNM may be a voltage lower by e.g. about 0.1 to 0.15 V from 0.45 V as the typical value. The input voltage range of the transistor TF3 is from 0.45 to 0.3 V and (VDDA−VIN)min=0.45 V. Therefore, (VDDA−VIN)min=0.45 V>VTNL+VBS+VPR+VTS as the on condition may be satisfied. Further, VTNL−VPR−VTS>0 as the off condition may also be satisfied. The avoidance conditions of performance degradation due to the off-leakage current, etc. may be satisfied by fine adjustment of the threshold voltage by elongation of the gate length L.

Further, in FIG. 8, a transistor of the kind PRM (medium withstand voltage) having a typical value of the threshold voltage at 0.45 V is used as the N-type transistor TF2 at the final stage. The gate length L of the transistor TF2 is slightly shorter than 0.4 µm as the standard gate length. The N-type transistor of the kind PRM is the reverse-short-channel-effect transistor. The gate length L is made slightly shorter, and thereby, the threshold voltage VTNM of the transistor TF2 may be set to a voltage slightly higher than 0.45 V as the typical value. The input voltage range of the transistor TF2 is from 0.3 to 0.15 V and (VDDA−VIN)min=0.6 V. Therefore, (VDDA−VIN)min=0.6 V>VTNM+VBS+VPR+VTS as the on condition may be satisfied. Further, VTNM−VPR−VTS>0 as the off condition may also be satisfied. The avoidance conditions of performance degradation due to the off-leakage current, etc. may be satisfied by fine adjustment of the threshold voltage by elongation of the gate length L.

For example, in FIG. 8, the locations where the avoidance conditions of performance degradation due to the off-leakage current are strict are boundaries between the P-type transistors and the N-type transistors, i.e., in the case where the transistor in which the off-leakage current IL is generated is the P-type transistor TF4 in FIG. 5 and the transistor in the on state in which the off-leakage current IL flows is the N-type transistor TF3. Also, in this case, performance degradation including increase in non-linearity error due to the off-leakage current may be avoided by fine adjustment of the threshold voltages by elongation of the gate lengths L.

Figure 9:
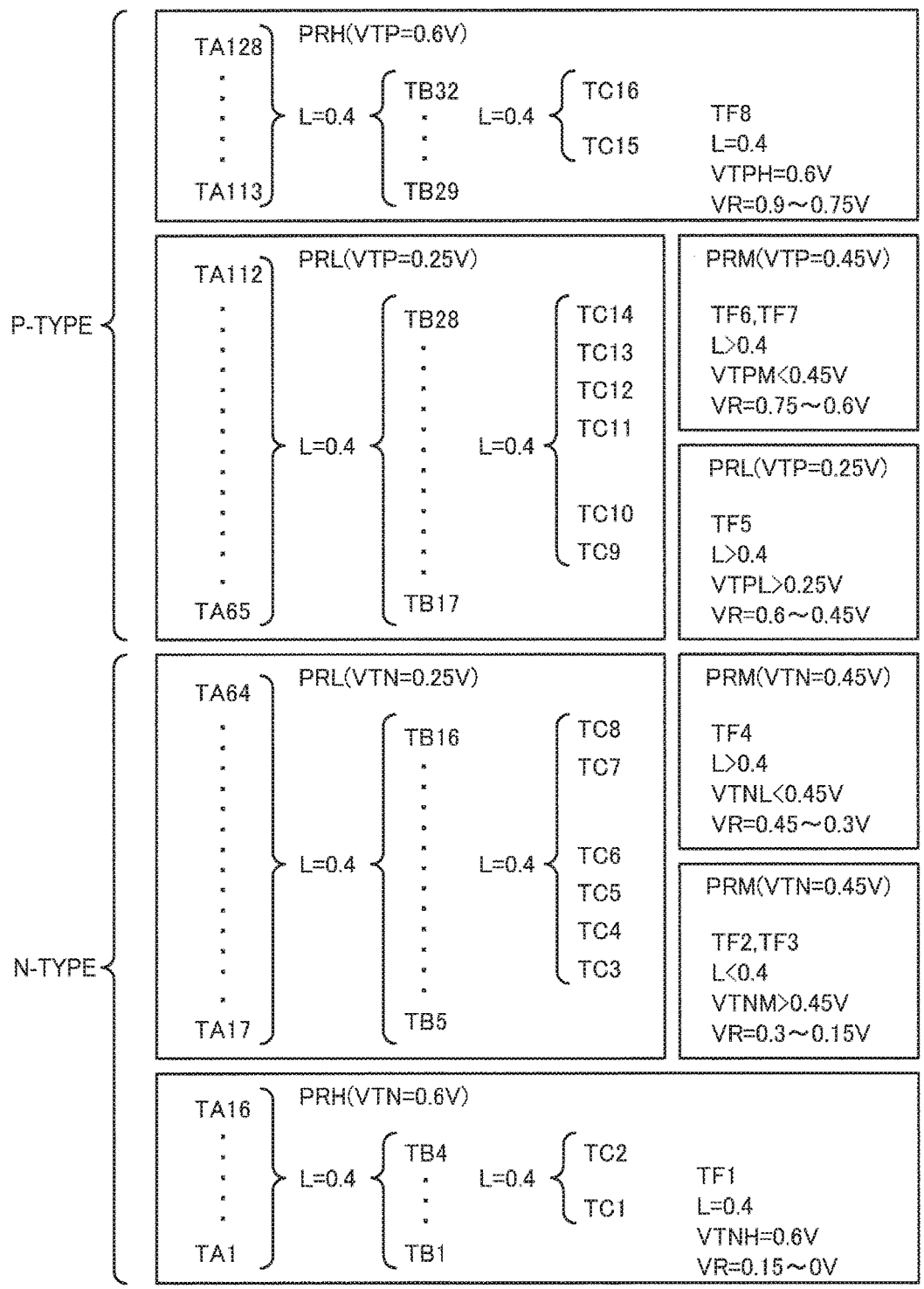
FIG. 9 shows another specific example of settings of the threshold voltages.

FIG. 9 shows another specific example of settings of the threshold voltages. In FIG. 9, the first selector block (BLA) includes 128 transistors TA1 to TA128, and the second selector block (BLB) includes 32 transistors TB1 to TB32. That is, the first selector block includes 32 4-input/1-output selectors and the second selector block includes 16 2-input/1-output selectors. Further, the third selector block includes 16 transistors TC1 to TC16, and the final selector block includes eight transistors TF1 to TF8. That is, the third selector block includes eight 2-input/1-output selectors and the final selector block includes one 8-input/1-output selectors. Note that the settings of the kinds PRH, PRM, PRL and the settings of the gate lengths L for these transistors are the same as those in FIG. 8, and the detailed explanation is omitted.

4. Power Source Circuit

Figure 10A:
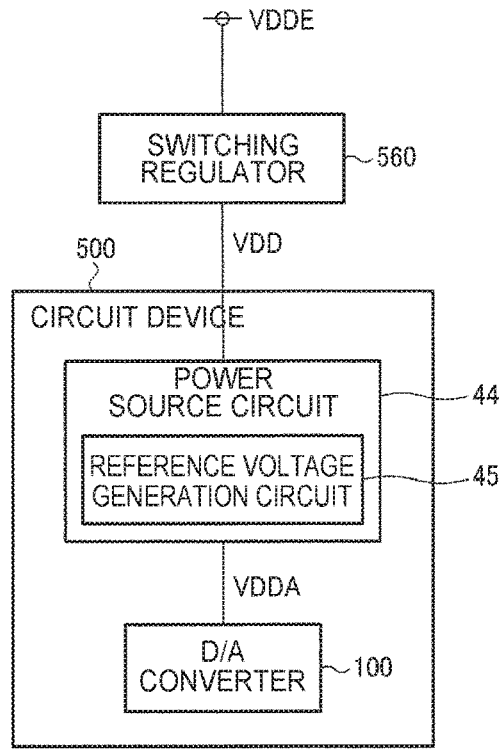
FIG. 10A shows a configuration example of a circuit device and an electronic apparatus.

FIG. 10A shows a configuration example of a circuit device 500 and an electronic apparatus including the circuit device 500. The electronic apparatus and the circuit device 500 may include other component elements (not shown).

The circuit device 500 includes a D/A converter 100 of the embodiment explained in FIGS. 1 to 9 and a power source circuit 44 that supplies the power source voltage (VDDA) to the D/A converter 100. The power source circuit 44 has a reference voltage generation circuit 45 that generates a reference voltage generated based on a work function difference between the transistors, and supplies the reference voltage generated by the reference voltage generation circuit 45 as the power source voltage (VDDA) to the D/A converter 100.

The electronic apparatus in FIG. 10A includes a switching regulator 560 (external power source circuit in a broad sense) and the circuit device 500. An external power source (VDD) is supplied from the switching regulator 560 to the power source circuit 44 of the circuit device 500.

The switching regulator 560 includes e.g. a switch element such as a transistor, an inductor, a capacitor, a diode, etc. In an on-period in which the switch element is on, a power source (VDDE) and one end of the inductor are connected via the switch element, and the inductor is driven and electric charge is supplied to the capacitor. In an off-period in which the switch element is off, the power source and the one end of the inductor are disconnected, and energy accumulated in the inductor is discharged and the electric charge is supplied to the capacitor via the diode. The output voltage of the switching regulator 560 is fed back, and thereby, the duty of the on-period and the off-period is controlled and the output voltage is kept constant.

Note that the configuration of the switching regulator 560 is not limited to that, but may be a DC-DC converter that intermittently connects and disconnects the power source by turning on and off the switch element.

The switching regulator 560 having the above described configuration produces little power loss due to resistance unlike a linear regulator and consumes lower power than the linear regulator. On the other hand, chopping is performed by the switch element, and noise of the generated power source voltage (VDD) is larger than that of the linear regulator. In this regard, in the configuration of FIG. 10A, the power source voltage (VDDA) is generated based on the work function difference, and thereby, high PSRR (Power Supply Rejection Ratio) can be realized with the suppressed power consumption of the power source circuit 44 and lower power consumption and lower noise as the whole power source system including the switching regulator 560 and the power source circuit 44 can be realized. For example, when PSRR is higher, the noise of the power source voltage (VDD) generated by the switching regulator 560 may be sufficiently reduced.

Figure 10B:
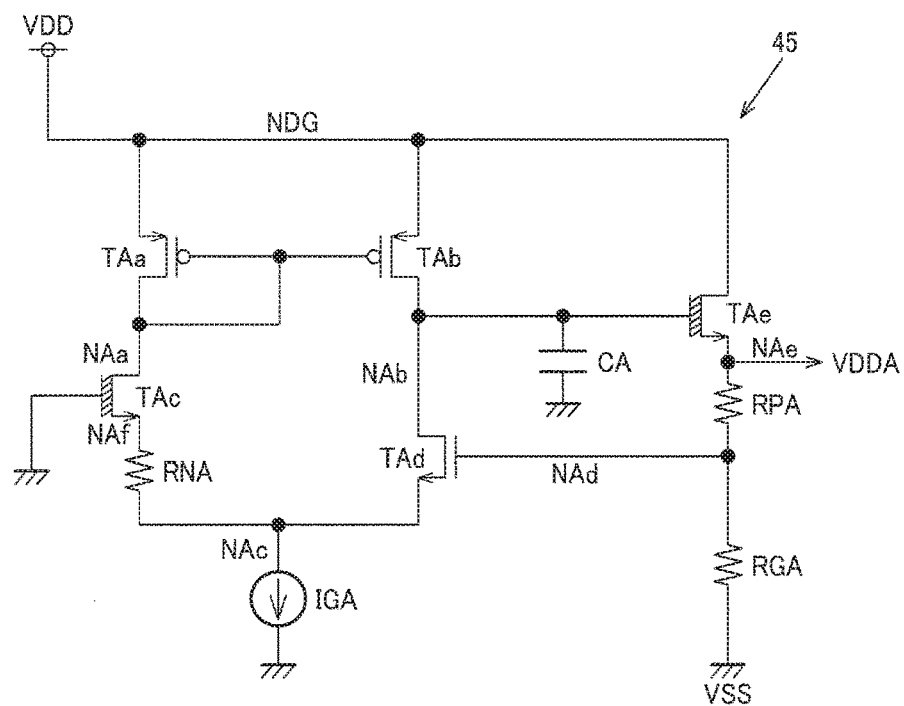
FIG. 10B shows a first configuration example of a reference voltage generation circuit.

FIG. 10B shows a first configuration example of the reference voltage generation circuit 45. The reference voltage generation circuit 45 in FIG. 10B includes transistors TAa, TAb, TAc, TAd, TAe, resistors RNA, RPA, RGA, a capacitor CA, and a current source IGA.

The transistor TAa and the transistor TAb form a current mirror circuit and supply currents to the transistor TAc and the transistor TAd. The transistor TAc and the transistor TAd form a differential pair. The current source IGA supplies bias currents to the differential pair. The transistors TAa, TAb are e.g. P-type transistors (first conductivity-type transistors in a broad sense) and the transistors TAc, TAd are e.g. N-type transistors (second conductivity-type transistors in a broad sense). Further, the transistors TAa, TAb, TAd are enhancement-type transistors and the transistor TAc is a depression-type transistor.

The power source voltage of VDD is supplied to the sources of the transistors TAa, TAb, and the gate electrodes of the transistors TAa, TAb are connected to a node NAa of the drain of the transistor TAc.

The transistors TAc, TAd are provided between the nodes NAa, NAb and nodes NAf, NAc. Further, the resistor RNA is provided between the node NAf and the node NAc. The power source voltage of VSS is input to the gate electrode of the transistor TAc. The gate electrode of the transistor TAd is connected to the node NAd. The current source IGA is provided between the node NAc and the power source node of VSS.

The transistor TAe is a depression N-type transistor. The transistor TAe is provided between a power supply node NDG of VDD and an output node NAe (one end of the resistor RPA), and the output node NAb of the differential pair is connected to the gate electrode thereof. That is, the gate voltage of the transistor TAe is controlled based on the drain voltage of the transistor TAd. The capacitor CA is provided between the node NAb and the node of VSS. The resistor RPA is provided between the output node NAe and the node NAd, and outputs the voltage of one end (node NAe) as the power source voltage VDDA as the reference voltage. The resistor RGA is provided between the node NAd and the node of VSS.

The transistor TAd is different from the transistor TAc in conductivity of the gate electrode. For example, the gate electrode of the transistor TAc is of the N type and the gate electrode of the transistor TAd is of the P type. For example, the transistors TAc and TAd are the same in impurity concentration of the substrate and impurity concentration of the channel, however, different in conductivity of the gate electrode and impurity concentration of the gate electrode.

For example, a threshold voltage of a MOS transistor may be expressed by $Vth=\phi_{MS}-Q_{SS}/C_{OX}+2\phi_F+Q_D/C_{OX}$. Here, $\phi_{MS}$ is a work function difference between a gate electrode and a substrate, $Q_{SS}$ is fixed charge within an oxide film, $C_{OX}$ is capacity per unit area of a gate oxide film, $\phi_F$ is a Fermi level, and $Q_D$ is charge within a depletion layer. The impurity concentration of the N-type gate electrode of the transistor TAc and the impurity concentration of the P-type gate electrode of the transistor TAd are set, and thereby, a threshold voltage VT1 of the depression-type transistor TAc is set to e.g. −0.52 V and a threshold voltage VT2 of the enhancement-type transistor TAd is set to e.g. 0.45 V. Therefore, to the output node NAe of the reference voltage generation circuit 45, the reference voltage of VT2−VT1=0.97 V is output as the power source voltage VDDA. That is, even when the power source VDD from the switching regulator 560 fluctuates, the power source voltage VDDA as the constant voltage can be supplied.

Figure 11:
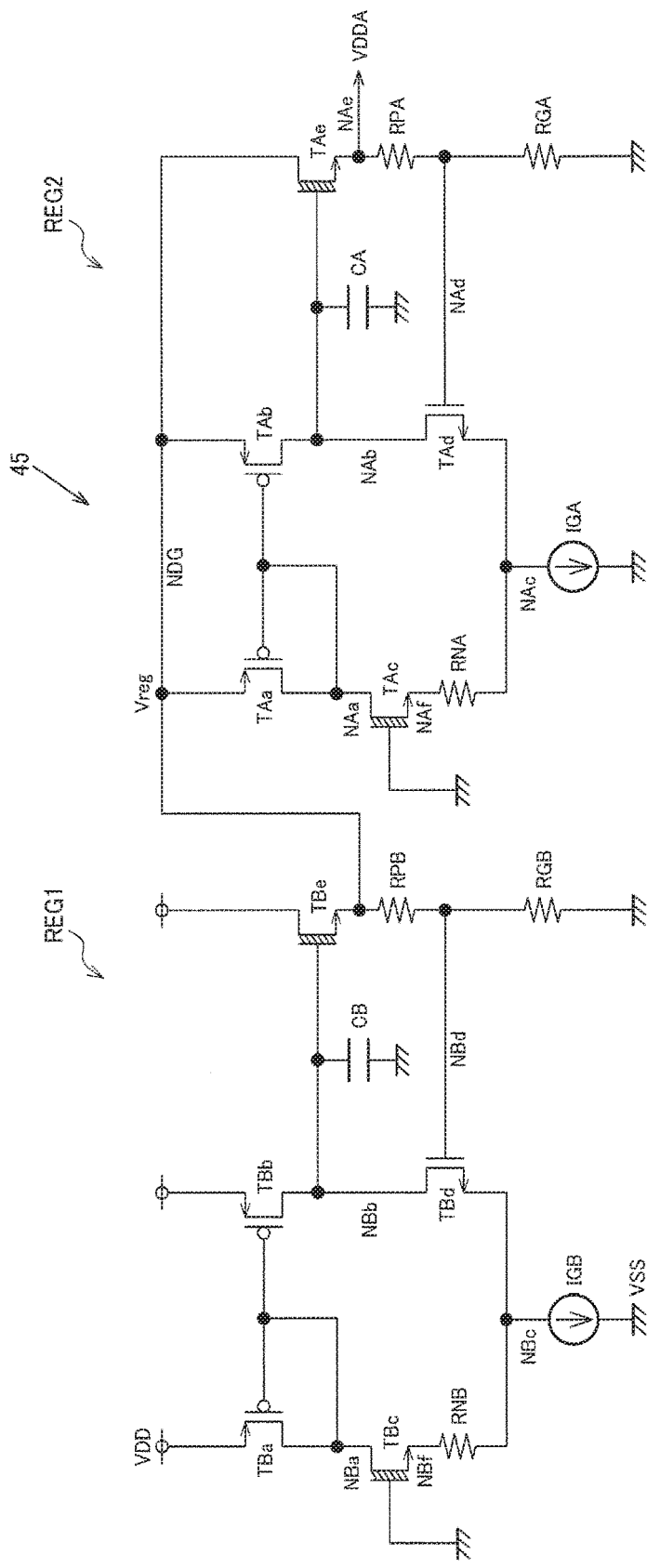
FIG. 11 shows a second configuration example of the reference voltage generation circuit.

FIG. 11 shows a second configuration example of the reference voltage generation circuit 45. The reference voltage generation circuit 45 in FIG. 11 includes a first work function difference amplifier REG1 and a second work function difference amplifier REG2. The first work function difference amplifier REG1 includes transistors TBa, TBb, TBc, TBd, TBe, resistors RNB, RPB, RGB, a capacitor CB, and a current source IGB. The second work function difference amplifier REG2 includes transistors TAa, TAb, TAc, TAd, TAe, resistors RNA, RPA, RGA, a capacitor CA, and a current source IGA.

The configurations of the first, second work function difference amplifiers REG1, REG2 are the same as the configuration of the circuit in FIG. 10B. That is, in FIG. 11, the circuits having the configuration in FIG. 10B are series-connected. Specifically, the first work function difference amplifier REG1 generates an output voltage Vreg as a reference voltage and the output voltage Vreg is supplied to a power source node NDG of the second work function difference amplifier REG2. In other words, the two work function difference amplifiers having the same circuit configuration are stacked. Further, the reference voltage generated by the second work function difference amplifier REG2 is output as the power source voltage VDDA. Specifically, the first work function difference amplifier REG1 outputs the voltage Vreg=0.97 V and the second work function difference amplifier REG2 outputs the power source voltage VDDA=0.9 V using the voltage Vreg=0.97 V as a power source.

As described above, the first work function difference amplifier REG1 and the second work function difference amplifier REG2 are series-connected, and thereby, PSRR may be more improved than that in the case of the single work function difference amplifier as shown in FIG. 10B.

According to the above described configurations in FIGS. 10A to 11, the reference voltage is generated based on the work function difference between the transistors and the reference voltage is supplied to the respective circuits including the circuit device 500 of the D/A converter 100 etc. as the power source voltage VDDA. Thereby, the lower power consumption of the D/A converter 100 and the circuit device 500 may be realized.

For example, as a comparative example of the embodiment, a technique of using a bandgap reference circuit as the reference voltage generation circuit 45 is considered. However, the bandgap reference circuit uses a plurality of bipolar transistors for cancelling temperature dependence of the band gap voltage, and current consumption including bias currents flowing in the transistors is larger. Accordingly, there is a problem that it is difficult to reduce the current consumption while maintaining the higher PSRR. For example, when the circuit device 500 is applied to an oscillator, the noise characteristics of the power source affects the accuracy of the oscillation signal of the oscillator (e.g. phase noise characteristics). Therefore, higher PSRR is necessary and, in this regard, the lower power consumption is limited in the power source circuit using the bandgap reference circuit.

On the other hand, in the power source circuit 44 of the embodiment, the power source voltage VDDA is generated based on the work function difference between the transistors, and thereby, the current consumption may be reduced and the higher PSRR may be maintained compared to the case using the bandgap reference circuit. For example, a differential pair is formed by the transistor TAc and the transistor TAd having different work functions between the gate electrode and the substrate, and the output of the differential pair is fed back by the transistor TAe to the differential pair, and thereby, the power source voltage VDDA may be generated. As described above, in the case of using the work function difference, the power source circuit 44 may be formed by the simpler configuration and the bias currents may be easily reduced.

Further, according to the power source circuit 44 of the embodiment, the higher PSRR is obtained, and thereby, the switching regulator 560 as shown in FIG. 10A can be used as an external power source at the further upstream side. In other words, the noise generated by the switching regulator 560 may be removed by the power source circuit 44 with the higher PSRR.

The reference voltage generation circuit 45 shown in FIGS. 10B, 11 has an advantage that the circuit size is smaller than that of the bandgap reference circuit. Accordingly, for example, such a configuration of the power source circuit 44 that the reference voltage generation circuit 45 is provided with respect to each circuit block of the circuit device can be employed. For example, a configuration in which a first reference voltage generation circuit supplies a power source voltage to the D/A conversion unit including the D/A converter 100 and second and third reference voltage generation circuits supply power source voltages to an A/D conversion unit and a processing unit, which will be described later, respectively, can be employed. Thereby, power source separation using the reference voltage generation circuits can be realized.

In the case where the power source circuit 44 as explained in FIGS. 10A to 11 is used, the voltage of VDDA is generated using the work function difference between the transistors, and VDDA becomes a very low voltage e.g. 0.9 V. Therefore, realization of proper D/A conversion (voltage selection) of the D/A converter 100 to which VDDA is supplied may be impossible.

In this regard, in the D/A converter 100 of the embodiment explained in FIGS. 1 to 9, as described above, the technique of setting the threshold voltage of the transistor on the far side from the power source node to the lower voltage than that of the transistor on the near side is employed. Further, the settings of the threshold voltages are realized by coarse adjustment using the kinds of transistors and fine adjustment using the gate lengths. Therefore, even when the voltage of VDDA is a very low voltage e.g. 0.9 V, proper D/A conversion of the D/A converter 100 can be realized.

5. Circuit Device

Figure 12:
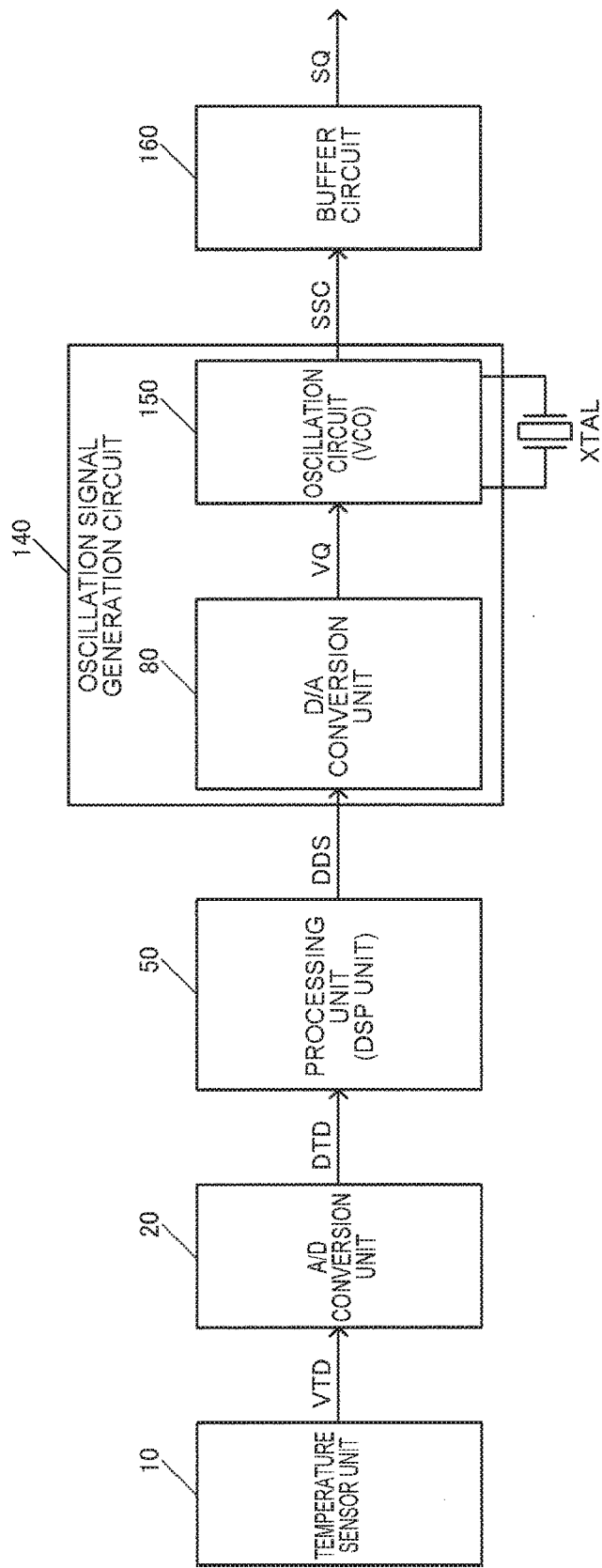
FIG. 12 shows a configuration example of the circuit device of the embodiment.

Next, an example of a configuration of a circuit device having the D/A converter 100 of the embodiment will be explained. For example, a circuit device in FIG. 12 is a circuit device (semiconductor chip) that realizes a digital oscillator such as a DTCXO or OCXO. The circuit device and a vibrator XTAL are housed in a package, and thereby, the digital oscillator is realized.

The circuit device in FIG. 12 includes an A/D conversion unit 20, a processing unit 50, and an oscillation signal generation circuit 140. Further, the circuit device may include a temperature sensor unit 10 and a buffer circuit 160. Note that the configuration of the circuit device is not limited to the configuration in FIG. 12, but various modifications such that part of the component elements (e.g. the temperature sensor unit, the buffer circuit, the A/D conversion unit, or the like) is omitted or another component element is added can be made.

The vibrator XTAL is a piezoelectric vibrator such as e.g. a quartz crystal vibrator. The vibrator XTAL may be an oven-controlled vibrator (OCXO) provided within a thermostatic bath. The vibrator XTAL may be a resonator (electromechanical resonator or electrical resonator). As the vibrator XTAL, a piezoelectric vibrator, a SAW (Surface Acoustic Wave) resonator, an MEMS (Micro Electro Mechanical Systems) vibrator, or the like may be employed. As a substrate material for the vibrator XTAL, a piezoelectric material including piezoelectric single crystal of quartz crystal, lithium tantalate, lithium niobate, etc., piezoelectric ceramics of lead zirconate titanate, a silicon semiconductor material, or the like may be used. As exciting means for the vibrator XTAL, the piezoelectric effect may be used or electrostatic drive by Coulomb force may be used.

The temperature sensor unit 10 outputs a temperature detection voltage VTD. Specifically, a temperature-dependent voltage that changes depending on the temperature of the environment (circuit device) is output as the temperature detection voltage VTD.

The A/D conversion unit 20 performs A/D conversion of the temperature detection voltage VTD from the temperature sensor unit 10 and outputs temperature detection data DTD. For example, the unit outputs digital temperature detection data DTD (A/D result data) corresponding to the A/D conversion result of the temperature detection voltage VTD. As the A/D conversion method of the A/D conversion unit 20, e.g. the sequential comparison method, a method similar to the sequential comparison method, or the like may be employed. Note that the A/D conversion method is not limited to the methods, but various methods (counting method, parallel comparison method, serial-parallel method, or the like) may be employed. The D/A converter of the embodiment in FIGS. 1 and 2, etc. may be used for the A/D conversion unit 20.

The processing unit 50 (DSP unit: digital signal processing unit) performs various kinds of signal processing. For example, the processing unit 50 (temperature compensation unit) performs temperature compensation processing of an oscillation frequency (frequency of the oscillation signal) based on the temperature detection data DTD. Then, the unit outputs frequency control data DDS of the oscillation frequency. Specifically, the processing unit 50 performs temperature compensation processing for keeping the oscillation frequency constant even when the temperature changes based on the temperature detection data DTD changing depending on the temperature (temperature-dependent data), coefficient data for temperature compensation processing (data of coefficients of an approximate function), or the like. The processing unit 50 may be realized using an ASIC circuit such as a gate array or realized using a processor and a program operating on the processor.

The oscillation signal generation circuit 140 generates an oscillation signal SSC. For example, the oscillation signal generation circuit 140 generates the oscillation signal SSC at the oscillation frequency set by the frequency control data DDS using the frequency control data DDS from the processing unit 50 and the vibrator XTAL. As an example, the oscillation signal generation circuit 140 generates the oscillation signal SSC by oscillating the vibrator XTAL at the oscillation frequency set by the frequency control data DDS.

Note that the oscillation signal generation circuit 140 may be a circuit that generates the oscillation signal SSC using the direct digital synthesizer method. For example, the circuit may digitally generate the oscillation signal SSC at the oscillation frequency set by the frequency control data DDS using the oscillation signal of the vibrator XTAL (the oscillation source of the fixed oscillation frequency) as a reference signal.

The oscillation signal generation circuit 140 may include a D/A conversion unit 80 and an oscillation circuit 150. Note that the oscillation signal generation circuit 140 is not limited to the configuration, but various modifications such that part of the component elements is omitted and another component element is added can be made.

The D/A conversion unit 80 performs D/A conversion of the frequency control data DDS from the processing unit 50 (output data of the processing unit). The frequency control data DDS input to the D/A conversion unit 80 is frequency control data (frequency control codes) after temperature compensation by the processing unit 50.

The oscillation circuit 150 generates the oscillation signal SSC using an output voltage VQ of the D/A conversion unit 80 and the vibrator XTAL. The oscillation circuit 150 is connected to the vibrator XTAL via first, second vibrator terminals (terminal pads). For example, the oscillation circuit 150 generates the oscillation signal SSC by oscillating the vibrator XTAL (piezoelectric vibrator, resonator, or the like). Specifically, the oscillation circuit 150 oscillates the vibrator XTAL at an oscillation frequency using the output voltage VQ of the D/A conversion unit 80 as a frequency control voltage (oscillation control voltage). For example, in the case where the oscillation circuit 150 is a circuit (VCO) that controls oscillation of the vibrator XTAL by voltage control, the oscillation circuit 150 may include a variable-capacitance capacitor (varicap capacitor or the like) having a capacitance value depending on the frequency control voltage.

Note that, as described above, the oscillation circuit 150 may be realized by the direct digital synthesizer method and, in this case, the oscillation frequency of the vibrator XTAL is the reference frequency different from the oscillation frequency of the oscillation signal SSC.

The buffer circuit 160 buffers the oscillation signal SSC generated in the oscillation signal generation circuit 140 (oscillation circuit 150) and outputs a signal SQ after buffering. That is, buffering for sufficiently driving external load is performed. The signal SQ is e.g. a clipped sine wave signal. Note that the signal SQ may be a rectangular wave signal. Or, the buffer circuit 160 may be a circuit that can output both the clipped sine wave signal and the rectangular wave signal as the signals SQ.

Figure 13:
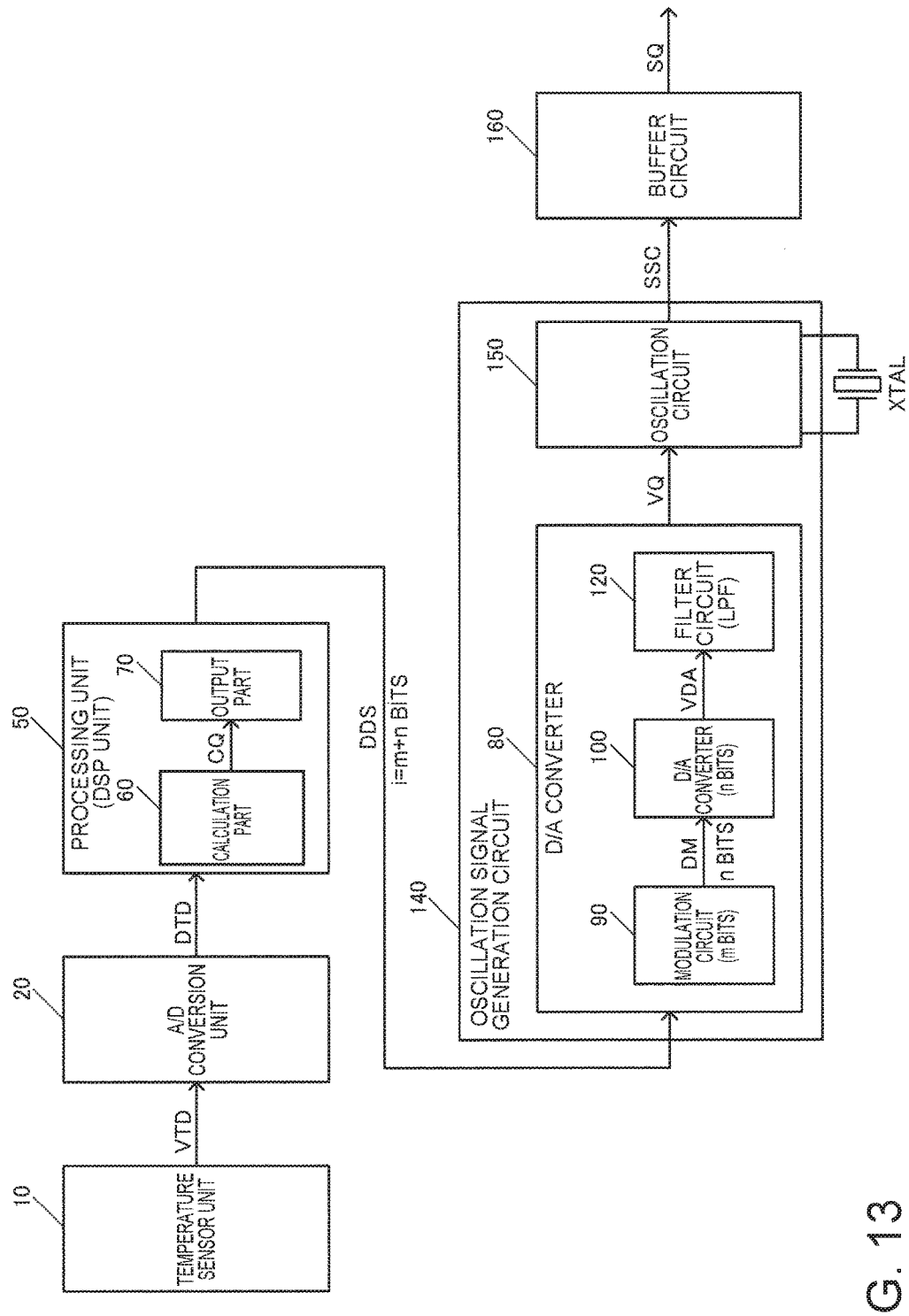
FIG. 13 shows a detailed configuration example of the circuit device of the embodiment.

FIG. 13 shows a detailed configuration example of the circuit device of the embodiment. In FIG. 13, the D/A conversion unit 80 includes a modulation circuit 90, the D/A converter 100, and a filter circuit 120.

The modulation circuit 90 of the D/A conversion unit 80 receives i=(n+m)-bit frequency control data DDS from the processing unit 50 (i, n, m are integers equal to or more than one). As an example, i=20, n=16, m=4. Further, the modulation circuit 90 modulates n-bit (e.g. 16-bit) data of the frequency control data DDS based on m-bit (e.g. 4-bit) data of the frequency control data DDS. Specifically, the modulation circuit 90 performs PWM modulation of the frequency control data DDS. Note that the modulation method of the modulation circuit 90 is not limited to PWM modulation (pulse width modulation), but may be pulse modulation such as PDM modulation (pulse density modulation) or another modulation method than the pulse modulation. For example, m-bit dither processing (dithering processing) is performed on the n-bit data of the frequency control data DDS, and thereby, bit expansion (bit expansion from n bits to i bits) may be realized.

The D/A converter 100 performs D/A conversion of the n-bit data modulated by the modulation circuit 90. For example, the converter performs D/A conversion of the n=16-bit data.

The filter circuit 120 smooths an output voltage VDA of the D/A converter 100. For example, the circuit smooths the output voltage VDA by low-pass filter processing. The filter circuit 120 is provided, and thereby, for example, PWM demodulation of the PWM-modulated signal can be performed. The cutoff frequency of the filter circuit 120 is set according to the frequency of the PWM modulation of the modulation circuit 90. That is, the signal of the output voltage VDA from the D/A converter 100 contains ripples of the fundamental frequency and the harmonic component of the PWM modulation, and the ripples are attenuated by the filter circuit 120. As the filter circuit 120, e.g. a passive filter using a passive element such as a resistor or capacitor may be employed. Note that, as the filter circuit 120, an active filter such as an SCF can be used.

For example, in TCXO as a temperature-compensated oscillator, there are demands for improvement in frequency accuracy and lower power consumption. For example, in a wearable apparatus such as a GPS-equipped watch or a measuring apparatus for biological information including pulse wave, it is necessary to elongate the operation duration by a battery. Accordingly, for TCXO as a reference signal source, lower power consumption with secured frequency accuracy is required.

Various systems are proposed as communication systems between communication terminals and base stations. For example, in the TDD (Time Division Duplex) system, each apparatus transmits data in assigned time slots. A guard time is set between the time slots (uplink slot, downlink slot), and thereby, overlap between the time slots is prevented. In the next-generation communication system, for example, data communication in the TDD system using a single frequency band (e.g. 50 GHz) is proposed.

However, in the case of employing the TDD system, time synchronization is necessary in each apparatus and timing of the correct time is required. To realize the requirement, for example, a technique of providing an atomic clock (atomic oscillator) as a reference signal source in each apparatus is considered, however, problems of cost increase of the apparatuses and upsizing of the apparatuses arise.

TCXO includes an ATCXO as an analog temperature-compensated oscillator and a DTCXO as a digital temperature-compensated oscillator.

In the case where ATCXO is used as a reference signal source, to increase the frequency accuracy, the chip size of the circuit device increases and realization of lower cost and lower power consumption becomes difficult. On the other hand, in DTCXO, there is an advantage that the higher frequency accuracy may be realized with little increase in the chip size of the circuit device.

However, in the digital oscillator such as DTCXO, there is a problem that communication errors or the like occur in a communication device incorporating the the oscillator due to frequency drift of the oscillation frequency. For example, in the digital oscillator, the temperature detection voltage from the temperature sensor unit is A/D-converted, the temperature compensation processing of the frequency control data is performed based on the obtained temperature detection data, and the oscillation signal is generated based on the frequency control data. In this case, it has been turned out that, when the value of the frequency control data largely changes due to temperature change, a problem of frequency hopping is caused. When the frequency hopping occurs, in a GPS-related communication device as an example, a problem of unlocking of GPS occurs.

To suppress the communication errors due to the frequency hopping and improve the frequency accuracy, it is necessary to raise the resolution of the D/A conversion unit 80 as high as possible.

However, for example, it is difficult to realize D/A conversion with high resolution of e.g. i=20 bits using only the D/A converter 100 of the resistance string type or the like. Further, when the output noise of the D/A conversion unit 80 is larger, it is difficult to realize the improvement of the frequency accuracy due to the noise.

Accordingly, in FIG. 13, the modulation circuit 90 is provided in the D/A conversion unit 80. Further, the processing unit 50 outputs the i=(n+m)-bit frequency control data DDS larger in the bit number than n bits (e.g. 16 bits) of the resolution of the D/A converter 100. The processing unit 50 performs floating-point arithmetic or the like for realizing e.g. digital signal processing of temperature compensation processing or the like, and can easily output the i=(n+m)-bit frequency control data DDS larger in the bit number than n bits (e.g. 16 bits).

The modulation circuit 90 performs modulation (PWM modulation or the like) of the n-bit data of the i=m+n based on the m-bit data of i=m+n, and outputs modulated n-bit data DM to the D/A converter 100. Then, the D/A converter 100 performs D/A conversion of the data DM, the filter circuit 120 performs smoothing processing of the obtained VDA, and thereby, D/A conversion with higher resolution of i=(m+n) bits (e.g. 20 bits) may be realized.

According to the configuration, for example, the resistance string type with less output noise or the like may be employed as the D/A converter 100, and thereby, the output noise of the D/A conversion unit 80 may be reduced and deterioration of the frequency accuracy may be easily suppressed. For example, noise is generated by the modulation in the modulation circuit 90, however, the noise may be sufficiently attenuated by the setting of the cutoff frequency of the filter circuit 120 and the deterioration of the frequency accuracy due to the noise may be suppressed.

Note that the resolution of the D/A conversion unit 80 is not limited to i=20 bits, but may be higher resolution or lower resolution than 20 bits. Further, the bit number of the modulation of the modulation circuit 90 is not limited to m=4 bits, but may be larger (e.g. m=8 bits) or smaller than 4 bits.

In FIG. 13, the processing unit 50 that performs digital signal processing such as temperature compensation processing provided at the previous stage of the D/A conversion unit 80 is effectively utilized. That is, the processing unit 50 executes the digital signal processing such as temperature compensation processing with higher accuracy using e.g. floating-point arithmetic or the like. Therefore, for example, the lower bit of the mantissa of the result of the floating-point arithmetic is also handled as effective data and converted into binary data, and thereby, the frequency control data DDS in the higher bit number e.g. i=m+n=20 bits may be easily output. In FIG. 13, with a focus on this point, the i=(m+n) bit-frequency control data DDS in the higher bit number is supplied to the D/A conversion unit 80, and D/A conversion with higher resolution of i=(m+n) bits is successfully realized using the m-bit modulation circuit 90 and the n-bit D/A converter 100.

As described above, the resolution of the D/A conversion unit 80 is made higher, and the above described frequency hopping may be suppressed. Thereby, communication errors or the like due to frequency hopping can be suppressed.

For other problems than frequency hopping, in the digital oscillator such as DTCXO or OCXO, very high frequency accuracy is required for the oscillation frequency. For example, in the above described TDD system, data is time-divisionally transmitted and received using the same frequency in the uplink and the downlink, and the guard times are set between the time slots assigned to the respective apparatuses. Accordingly, to realize proper communication, time synchronization is necessary in the respective apparatuses and timing of the correct time is required. For example, in the case where hold over referring to disappearance or abnormality of a reference signal (GPS signal or signal via the Internet) occurs, it is necessary for the oscillator side to correctly time the absolute time without the reference signal. Accordingly, very high frequency accuracy is required for the oscillator used for the apparatuses (GPS-related apparatuses, base stations, etc.)

For example, if a technique of providing atomic clocks in the respective apparatuses is employed to realize the requirement, cost increase and upsizing of the apparatuses are caused. Or, even when the oscillator with the higher frequency accuracy is realized, it is not desirable that the circuit device used for the oscillator is upsized and the power consumption is very high.

In this regard, according to the configuration of the circuit device in FIG. 13, only by providing the modulation circuit 90 and the filter circuit 120, the D/A conversion unit 80 with very high resolution of e.g. i≥20 bits may be realized and the higher accuracy of the oscillation frequency may be realized by the higher resolution. The increase of the chip size and the increase of the power consumption of the circuit device due to the modulation circuit 90 and the filter circuit 120 are not so significant. Further, in the processing unit 50, the temperature compensation processing is executed using floating-point arithmetic or the like, and thereby, the frequency control data DDS of e.g. i≥20 bits may be easily output to the D/A conversion unit 80. Therefore, the configuration of the circuit device in FIG. 13 has an advantage that both higher accuracy of the oscillation frequency and suppression of increase in size and power consumption of the circuit device may be realized.

Note that the circuit device in FIGS. 12 and 13 may be used as an oscillation IC in a PLL circuit having a phase comparison circuit that compares input signals based on the reference signal (GPS signal or signal via the Internet) and the oscillation signal. In this case, for example, the processing unit 50 may perform temperature compensation processing, aging correction processing, or the like on the frequency control data from the phase comparison circuit and the oscillation signal generation circuit 140 may generate an oscillation signal.

Further, the processing unit 50 outputs frequency control data DDS that, when the temperature changes from a first temperature to a second temperature, changes in units of k×LSB (changes by k×LSB) from first data corresponding to the first temperature (first temperature detection data) to second data corresponding to the second temperature (second temperature detection data). Here, k≥1 and k is an integer equal to or larger than one. For example, letting the bit number of the frequency control data DDS (resolution of the D/A conversion unit) be i, k<$2^i$ and k is an integer sufficiently smaller than $2^-$ (e.g. k=1 to 8). More specifically, k<$2^m$. For example, for k=1, the processing unit 50 outputs frequency control data DDS changing from the first data to the second data in units of 1 LSB (units of one bit). In other words, the unit outputs frequency control data DDS that changes while shifting by 1 LSB (one bit) from the first data toward the second data. Note that the change step width of the frequency control data DDS is not limited to 1 LSB, but may be equal to or larger than 2×LSB e.g. 2×LSB, 3×LSB, 4×LSB . . . .

For example, the processing unit 50 includes a calculation part 60 and an output part 70. The calculation part 60 performs calculation of the temperature compensation processing of the oscillation frequency based on the temperature detection data DTD. For example, the part realizes the temperature compensation processing by digital signal processing using floating-point arithmetic or the like. The output part 70 receives calculation result data CQ from the calculation part 60 and outputs the frequency control data DDS. Then, the output part 70 performs output processing of the frequency control data DDS that, when the calculation result data CQ changes from the first data corresponding to the first temperature to the second data corresponding to the second temperature, changes from the first data to the second data in units of k×LSB.

As described above, if the frequency control data DDS output from the processing unit 50 changes by k×LSB, for example, when the temperature changes from the first temperature to the second temperature, a situation that a large voltage change is caused in the output voltage VQ of the D/A conversion unit 80 and frequency hopping occurs due to the voltage change may be suppressed. Thereby, communication errors or the like due to the frequency hopping may be prevented.

Figure 14A:
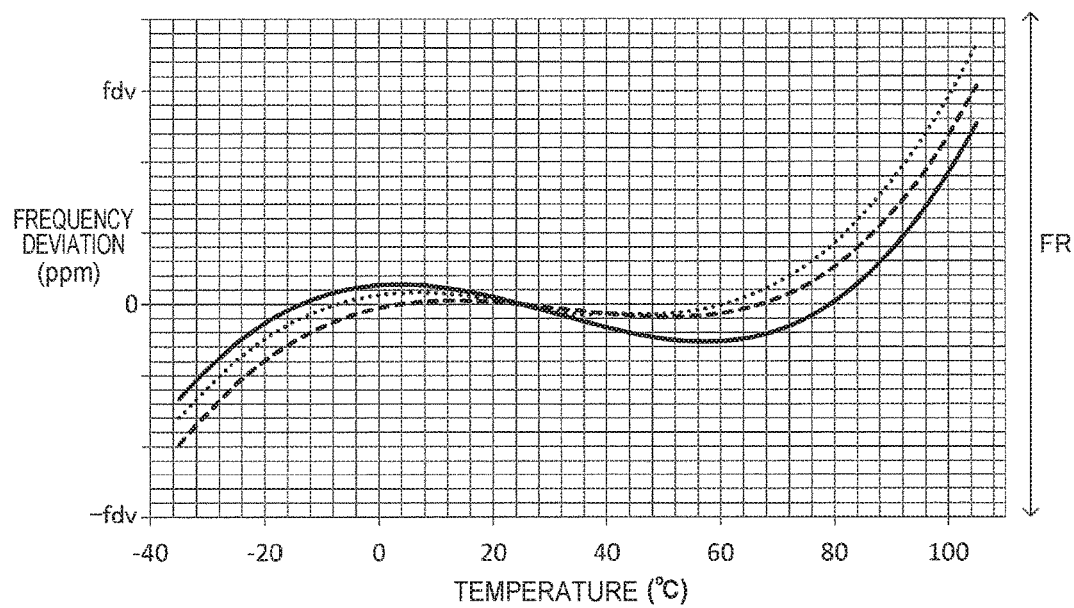
FIGS. 14A and 14B are explanatory diagrams of temperature compensation processing.

FIG. 14A shows an example of frequency deviation of the oscillation frequency depending on the temperature of the vibrator XTAL (AT vibrator or the like). The processing unit 50 performs temperature compensation processing for keeping the oscillation frequency of the vibrator XTAL having the temperature characteristics as shown in FIG. 14A constant independent of the temperature.

Figure 14B:
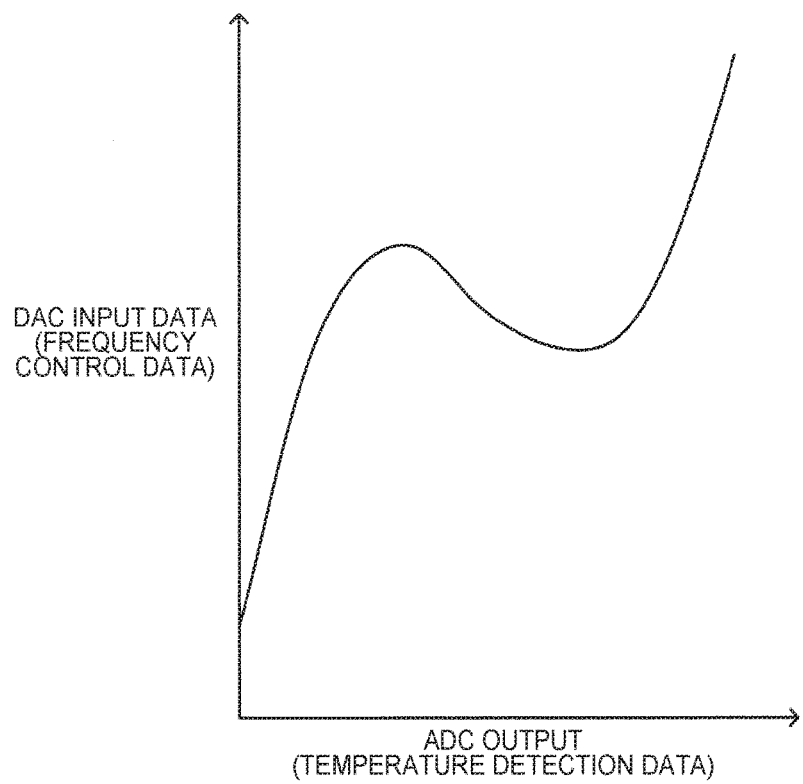

Specifically, the processing unit 50 executes temperature compensation processing so that output data (temperature detection data) of the A/D conversion unit 20 and input data (frequency control data) of the D/A conversion unit 80 have a correspondence relationship as shown in FIG. 14B. The correspondence relationship (frequency correction table) in FIG. 14B may be acquired by e.g. a technique of placing an oscillator incorporating the circuit device in a thermostatic oven and monitoring input data (DDS) of the D/A conversion unit 80 and output data (DTD) of the A/D conversion unit 20 at the respective temperatures or the like.

Then, coefficient data of an approximate function for temperature compensation for realization of the correspondence relationship in FIG. 14B is stored in a memory part (nonvolatile memory) of the circuit device. Then, the processing unit 50 performs calculation processing based on the coefficient data read from the memory part and the temperature detection data DTD from the A/D conversion unit 20, and realizes the temperature compensation processing for keeping the oscillation frequency of the vibrator XTAL constant independent of the temperature. Note that the temperature detection voltage VTD of the temperature sensor unit 10 has e.g. negative temperature characteristics. Therefore, the temperature compensation characteristics as shown in FIG. 14B may cancel out and compensate for the temperature dependence of the oscillation frequency of the vibrator XTAL in FIG. 14A.

6. D/A Conversion Unit

Figure 15:
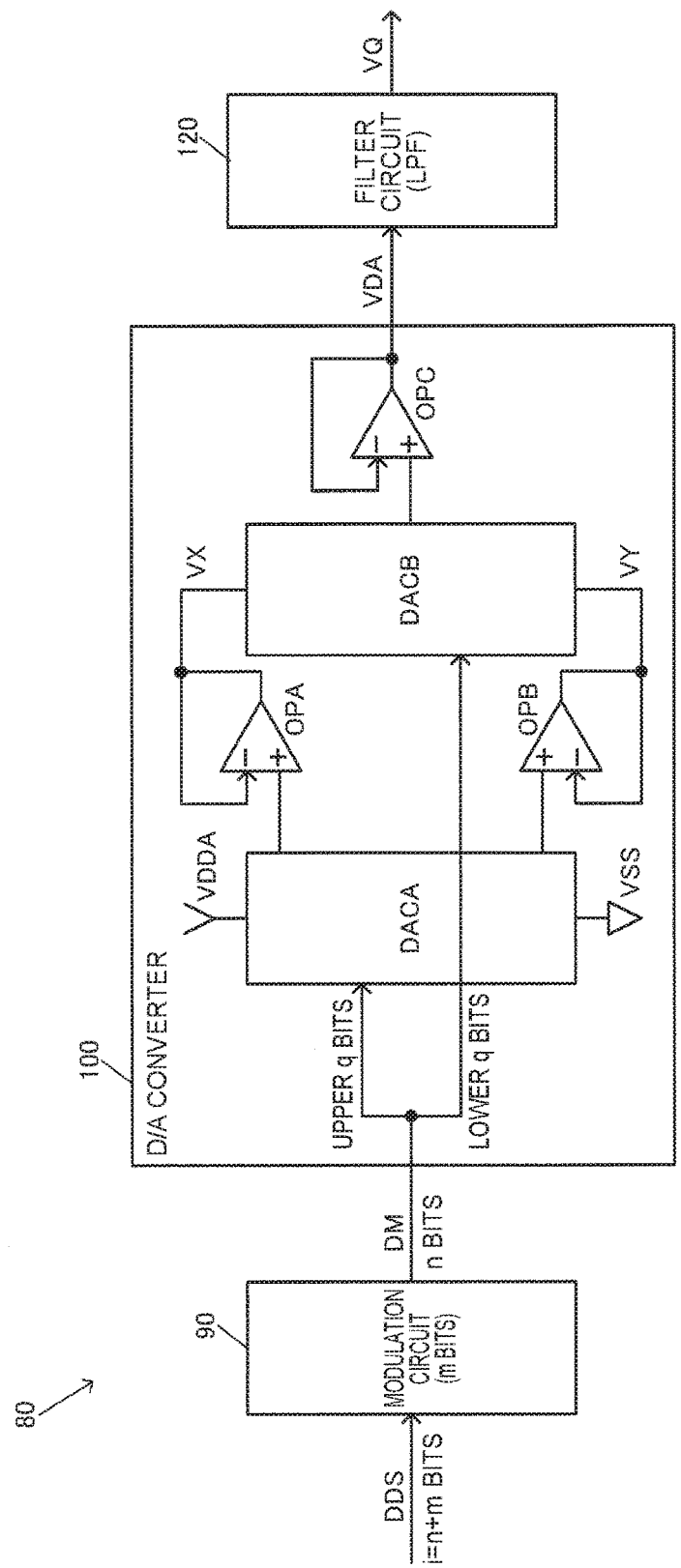
FIG. 15 shows a detailed configuration example of a D/A conversion unit.
Figure 16:
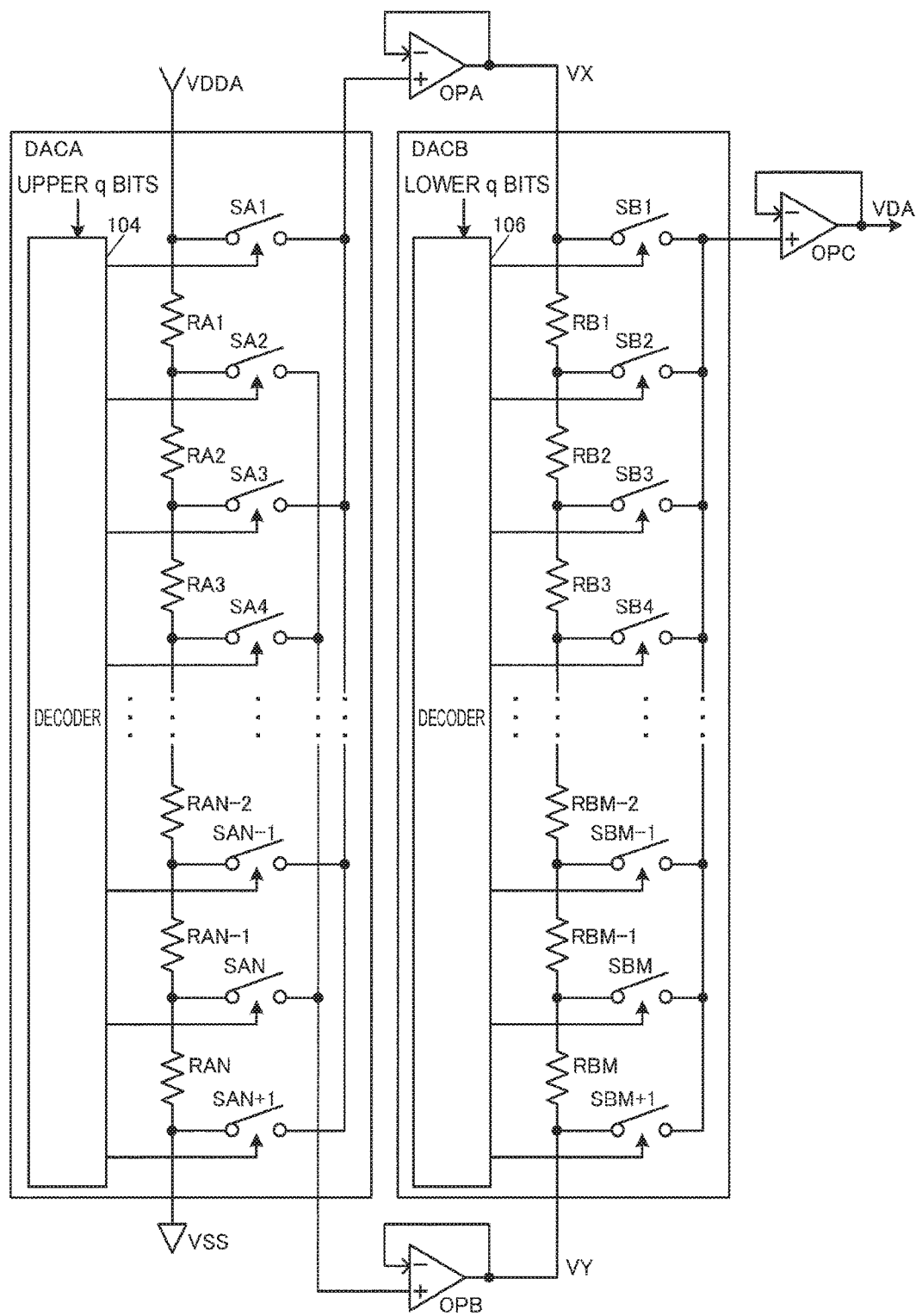
FIG. 16 shows a more detailed configuration example of the D/A conversion unit.

FIGS. 15 and 16 show detailed configuration examples of the D/A conversion unit 80. The D/A conversion unit 80 includes the modulation circuit 90, the D/A converter 100, and the filter circuit 120.

As shown in FIG. 15, the D/A converter 100 includes an upper D/A converter DACA, a lower D/A converter DACB, and voltage follower operation amplifiers OPA, OPB, OPC. The D/A converter of the embodiment explained in FIGS. 1, 2, etc. is used as the upper D/A converter DACA, for example.

Upper q-bit data of the n-bit (=q+p) data DM from the modulation circuit 90 is input to the upper DACA and lower p-bit (e.g. p=q=8) data is input to the lower DACB. These upper DACA and lower DACB are e.g. resistance string-type D/A converters that select voltages corresponding to input data from a plurality of divided voltages voltage-divided by a plurality of series-connected resistors.

As shown in FIG. 16, the upper DACA includes a plurality of resistors RA1 to RAN series-connected between the node of the high-potential-side power source VDDA and the node of the low-potential-side power source VSS. Further, the upper DACA includes a plurality of switch elements SA1 to SAN+1 with one ends connected to voltage division nodes by these resistors RA1 to RAN and a decoder 104 (switch control circuit) that generates switch control signals for turning on or off the switch elements SA1 to SAN+1 based on the upper q-bit data of the data DM.

The connection configuration of these switches etc. is actually the connection configuration as shown in FIG. 2, however, simplified here. For example, the upper DACA has two sets of first, second voltage selection circuits having the configurations in FIG. 2. Further, for example, the transistors of the selectors forming the first voltage selection circuit correspond to the switch elements SA1, SA3, SA5 . . . and the transistors of the selectors forming the second voltage selection circuit correspond to the switch elements SA2, SA4, SA6 . . . .

The upper DACA outputs one divided voltage of the divided voltages on both ends of the resistor specified by the upper q-bit data of the plurality of resistors RA1 to RAN to the non-inverting input terminal of the operational amplifier OPA and the other divided voltage to the non-inverting input terminal of the operational amplifier OPB. Thereby, the one voltage is impedance-converted by the voltage follower operational amplifier OPA and supplied to the lower DACB as a voltage VX. Further, the other voltage is impedance-converted by the voltage follower operational amplifier OPB and supplied to the lower DACB as a voltage VY.

For example, when the resistor RA1 is specified by the upper q-bit data, the divided voltage on the high potential side of the divided voltages on both ends of the resistor RA1 is supplied as the voltage VX via the on switch element SA1 and the operational amplifier OPA. Further, the divided voltage on the low potential side is supplied as the voltage VY via the on switch element SA2 and the operational amplifier OPB. Or, when the resistor RA2 is specified by the upper q-bit data, the divided voltage on the low potential side of the divided voltages on both ends of the resistor RA2 is supplied as the voltage VX via the on switch element SA3 and the operational amplifier OPA. Further, the divided voltage on the high potential side is supplied as the voltage VY via the on switch element SA2 and the operational amplifier OPB.

The lower DACB includes a plurality of resistors RB1 to RBM series-connected between the node of the voltage VX and the node of the voltage VY. Further, the lower DACB includes a plurality of switch elements SB1 to SBM+1 with one ends connected to voltage division nodes by these resistors RB1 to RBM and a decoder 106 (switch control circuit) that generates switch control signals for turning on or off the switch elements SB1 to SBM+1 based on the lower p-bit data of the data DM.

The lower DACB outputs one divided voltage selected by the lower p-bit data of the divided voltages of the plurality of resistors RB1 to RBM to the non-inverting input terminal of the voltage follower operational amplifier OPC via the on switch element. Thereby, the selected voltage is output as the output voltage VDA of the D/A converter 100.

FIGS. 17A, 17B, 17C are explanatory diagrams of the modulation circuit 90. As shown in FIG. 17A, the modulation circuit 90 receives the i=(n+m)-bit frequency control data DDS from the processing unit 50. Then, the circuit performs PWM modulation of upper n-bit data (bits b5 to b20) of the frequency control data DDS based on lower m-bit data (bits b1 to b4) of the frequency control data DDS. Of the n-bit data, the upper q-bit data (bits b13 to b20) is input to the upper DACA and the lower p-bit data (bits b5 to b12) is input to the lower DACB.

FIG. 17B is the explanatory diagram of a first method of the PWM modulation. DY, DZ are the upper n-bit data of the data DM and DY=DZ+1 holds in the n-bit representation.

When the duty ratio represented by the lower m=4-bit data used for the PWM modulation is 8:8, as shown in FIG. 17B, eight 16-bit data DY and eight 16-bit data DZ are time-divisionally output from the modulation circuit 90 to the D/A converter 100.

When the duty ratio represented by the lower m=4-bit data is 10:6, ten data DY and six data DZ are time-divisionally output from the modulation circuit 90 to the D/A converter 100. Similarly, when the duty ratio represented by the lower m=4-bit data is 14:2, fourteen data DY and two data DZ are time-divisionally output.

FIG. 17C is the explanatory diagram of a second method of the PWM modulation. If the respective bits b4, b3, b2, b1 of the m=4 bits used for the PWM modulation are at the logic level "1", output patterns corresponding to the respective bits in FIG. 17C (output patterns shown on the right sides of the respective bits) are selected.

For example, for bit b4=1 and b3=b2=b1=0, only the output pattern corresponding to the bit b4 is output in periods P1 to P16. That is, n=16-bit data is time-divisionally output from the modulation circuit 90 to the D/A converter 100 in the order of DZ, DY, DZ, DY . . . . Thereby, both of the numbers of times of output of the data DY, DZ are eight and the same PWM modulation as that when the duty ratio is 8:8 in FIG. 17B is realized.

Or, for bit b4=b2=1 and b3=b1=0, the output patterns corresponding to the bits b4 and b2 are output in the periods P1 to P16. Thereby, the numbers of times of output of the data DY, DZ are ten, six, respectively, and the same PWM modulation as that when the duty ratio is 10:6 is realized. Similarly, for bit b4=b3=b2=1 and b1=0, the numbers of times of output of the data DY, DZ are fourteen, two, respectively, and the same PWM modulation as that when the duty ratio is 14:2 is realized.

As described above, according to the modulation circuit 90 of the embodiment, only the numbers of times of output of the data DY, DZ or the like are controlled, and thereby, the PWM modulation may be realized. For example, D/A conversion resolution of 20 bits or more may be realized even using the D/A converter 100 having e.g. 16-bit resolution.

For example, in the resistance string-type or resistance ladder-type D/A conversion with less noise, e.g. resolution of about 16 bits is a substantial limitation. In this regard, according to the embodiment, only by providing the modulation circuit 90 and the filter circuit 120 having the smaller circuit sizes, the D/A conversion resolution may be improved to e.g. 20 bits or more. Therefore, the resolution of the D/A conversion unit 80 can be improved with the minimized increase in circuit size. The resolution of the D/A conversion unit 80 is improved, and thereby, higher oscillation frequency accuracy may be realized, and frequency hopping may be suppressed, and an oscillator suitable for time synchronization may be provided.

7. Oscillator, Electronic Apparatus, Moving Object

Figure 18A:
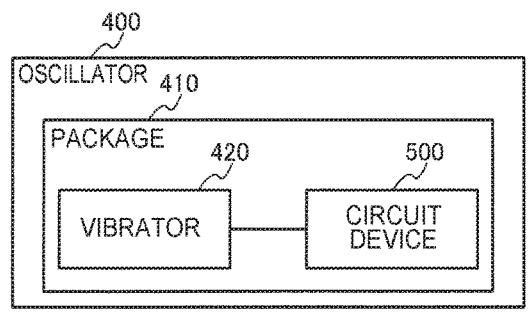
FIGS. 18A, 18B, 18C show configuration examples of an oscillator, an electronic apparatus, and a moving object.

FIG. 18A shows a configuration example of an oscillator 400 including a circuit device 500 of the embodiment. As shown in FIG. 18A, the oscillator 400 includes a vibrator 420 and the circuit device 500. The vibrator 420 and the circuit device 500 are mounted within a package 410 of the oscillator 400. Further, the terminal of the vibrator 420 and the terminal (pad) of the circuit device 500 (IC) are electrically connected by internal wiring of the package 410.

Figure 18B:
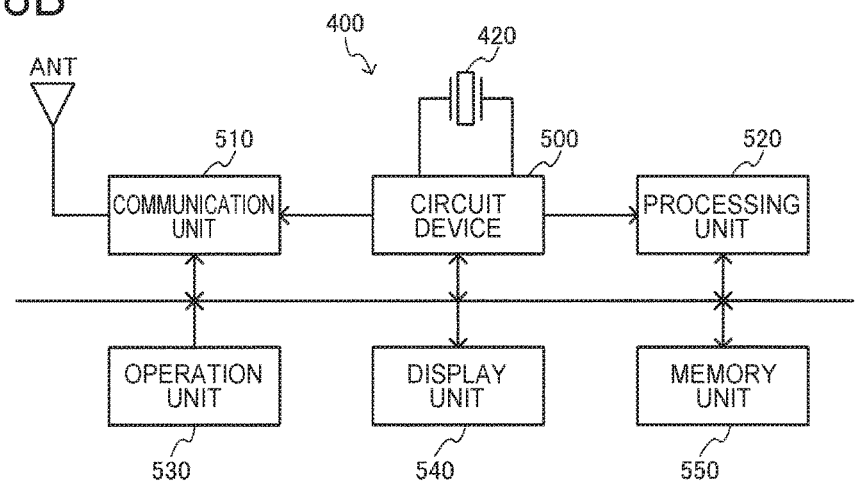

FIG. 18B shows a configuration example of an electronic apparatus including a circuit device 500 (D/A converter) of the embodiment. The electronic apparatus includes the circuit device 500 (D/A converter) of the embodiment, a vibrator 420 such as a quartz crystal vibrator, an antenna ANT, a communication unit 510, and a processing unit 520. Further, the device may include an operation unit 530, a display unit 540, and a memory unit 550. An oscillator 400 is formed by the vibrator 420 and the circuit device 500. Note that the electronic apparatus is not limited to the configuration in FIG. 18B, but various modifications such that part of the component elements is omitted and another component element is added can be made.

As the electronic apparatus in FIG. 18B, for example, various apparatuses including a wearable apparatus such as a GPS-equipped watch, biological information measuring apparatus (sphygmograph, pedometer, or the like), or head-mounted display apparatus, a portable information terminal (mobile terminal) such as a smartphone, cell phone, portable game machine, notebook PC, or tablet PC, a content distribution terminal that delivers contents, a video apparatus such as a digital camera or video camera, and a network-related apparatus such as abase station or router may be assumed.

The communication unit 510 (wireless circuit) performs processing of receiving data from outside and transmitting data to outside via the antenna ANT. The processing unit 520 performs control processing of the electronic apparatus and various kinds of digital processing of data transmitted and received via the communication unit 510. The function of the processing unit 520 may be realized using a processor such as a microcomputer, for example.

The operation unit 530 is for a user to perform input operation and may be realized by an operation button or a touch panel display. The display unit 540 displays various kinds of information and may be realized by a liquid crystal or organic EL display. Note that, when the touch panel display is used as the operation unit 530, the touch panel display has functions of both the operation unit 530 and the display unit 540. The memory unit 550 stores data and the function thereof may be realized by a semiconductor memory such as a RAM or ROM, a HDD (hard disk drive), or the like.

Figure 18C:
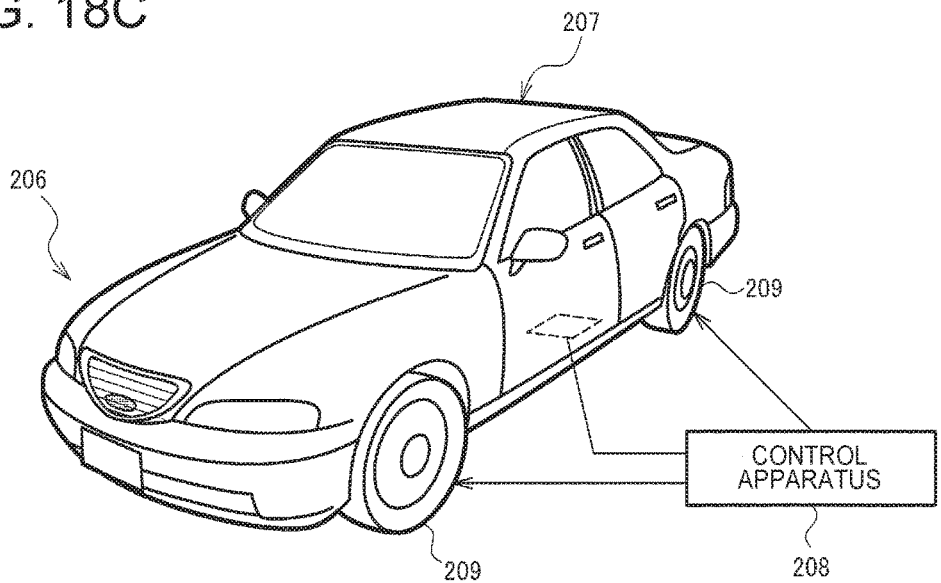

FIG. 18C shows an example of a moving object including a circuit device of the embodiment. The circuit device (oscillator) of the embodiment may be incorporated into various moving objects such as vehicles, airplanes, motorbikes, bicycles, or ships, for example. The moving objects are apparatuses or systems that move on the ground, in the sky, on the sea including drive mechanisms of engines and motors, steering mechanisms of steering wheels and rudders, and various kinds of electronic apparatuses (on-board apparatuses). FIG. 18C schematically shows an automobile 206 as a specific example of the moving object. An oscillator (not shown) having the circuit device of the embodiment and a vibrator is incorporated in the automobile 206. A control apparatus 208 operates according to clock signals generated by the oscillator. For example, the control apparatus 208 controls hardness and softness of the suspension according to the attitude of a vehicle 207 and controls brakes of individual wheels 209. For example, automated driving of the automobile 206 may be realized by the control apparatus 208. Note that the apparatus in which the circuit device of the embodiment and the oscillator are incorporated is not limited to the control apparatus 208, but may be various apparatuses (on-board apparatuses) provided in the moving object such as the automobile 206.

The embodiment is explained in detail as described above, however, a person skilled in the art could readily understand that many modifications without substantially departing from the new matter and effects of the invention can be made. Therefore, the scope of the invention includes these modified examples. For example, in the specification or drawings, terms at lease once described with different terms in the broader or synonymous senses may be replaced by the different terms in any part of the specification or drawings. Further, the scope of the invention includes all of the combinations of the embodiment and the modified examples. The configurations and operations of the D/A converter, the circuit device, the oscillator, the electronic apparatus, and the moving object, the D/A conversion technique, the voltage selection technique, the setting technique of the threshold voltages, etc. are not limited to those explained in the embodiment, but various modifications can be made.

The entire disclosure of Japanese Patent Application No. 2015-242798, filed Dec. 14, 2015 is expressly incorporated by reference herein.

What is claimed is:

1. A D/A converter comprising:
   a decoder that performs decoding processing of input data and outputs a control signal;
   a voltage generation circuit that generates and outputs a plurality of voltages; and
   a voltage selection circuit that selects and outputs a voltage corresponding to the input data as a D/A-converted voltage from the plurality of voltages based on the plurality of voltages from the voltage generation circuit and the control signal from the decoder,
   wherein the voltage selection circuit includes a plurality of stages of selector blocks in which an output of a selector of selector blocks at a previous stage of the plurality of stages is input to selectors of respective selector blocks at a subsequent stage of the plurality of stages,
   the plurality of voltages are input to the selector block at a first stage of the plurality of stages of selector blocks, and the selector block at a final stage of the plurality of stages of selector blocks outputs the D/A-converted voltage,
   each of the plurality of stages of selector blocks includes a plurality of transistors and, of the plurality of transistors forming the selector block, a second transistor on a far side from a power source node is set to a lower threshold voltage than that of a first transistor on a near side from the power source node, and
   the first transistor is a first kind of transistor having a first threshold voltage having a first target value selected in accordance with a first manufacturing process, and the second transistor is a second kind of transistor having a second threshold voltage lower than the first threshold voltage.

2. The D/A converter according to claim 1, wherein, of the plurality of transistors forming the selector block, a second P-type transistor on a far side from a high-potential-side power source node is set to a lower threshold voltage than that of a first P-type transistor on a near side from the high-potential-side power source node, and a second N-type transistor on a far side from a low-potential-side power source node is set to a lower threshold voltage than that of a first N-type transistor on a near side from the low-potential-side power source node.

3. A circuit device comprising:
   the D/A converter according to claim 2; and
   a power source circuit that supplies a power source voltage to the D/A converter,
   wherein the power source circuit has a reference voltage generation circuit that includes a third transistor and a fourth transistor and generates a reference voltage based on a work function difference between the third and fourth transistors, and supplies the reference voltage generated by the reference voltage generation circuit to the D/A converter as the power source voltage.

4. A circuit device comprising:
the D/A converter according to claim 2;
an A/D conversion unit that performs A/D conversion of a temperature detection voltage from a temperature sensor unit and outputs temperature detection data;
a processing unit that performs temperature compensation processing of an oscillation frequency based on the temperature detection data and outputs frequency control data for the oscillation frequency; and
an oscillation signal generation circuit that generates an oscillation signal at the oscillation frequency set by the frequency control data using the frequency control data from the processing unit and a vibrator,
wherein the oscillation signal generation circuit includes
a D/A conversion unit that has the D/A converter and performs D/A conversion of the frequency control data from the processing unit, and
an oscillation circuit that generates the oscillation signal using an output voltage of the D/A conversion unit and the vibrator.

5. An electronic apparatus comprising the D/A converter according to claim 2.

6. The D/A converter according to claim 1, wherein the first transistor and the second transistor are different in gate length.

7. The D/A converter according to claim 1, wherein, of the plurality of transistors forming the selector block, a third transistor on a farther side from the power source node than the second transistor is set to a lower threshold voltage than that of the second transistor.

8. The D/A converter according to claim 7, wherein the first transistor is a first kind of transistor having a first threshold voltage having a first target value selected in accordance with a first manufacturing process, the second transistor is a second kind of transistor having a second threshold voltage lower than the first threshold voltage, and the third transistor is a third kind of transistor having a third threshold voltage lower than the second threshold voltage.

9. The D/A converter according to claim 8, wherein at least one transistor of the first, second, third transistors is different in gate length from a other transistors of the first, second, third transistors.

10. The D/A converter according to claim 1, wherein the first transistor and the second transistor are different in manufacturing process parameter of the transistors and set to different threshold voltages.

11. The D/A converter according to claim 1, wherein a gate length of at least one transistor forming the selector block at the final stage is longer than gate lengths of other transistors forming the selector block at the final stage.

12. The D/A converter according to claim 1, wherein a gate length of at least one transistor forming the selector block at the final stage is longer than gate lengths of the transistors forming the selector block at the first stage.

13. The D/A converter according to claim 1, wherein at least one transistor forming the selector block at the final stage is a transistor at a controlled substrate voltage.

14. The D/A converter according to claim 1, wherein a selector of the selector block at the final stage is a selector to which I voltages are input from the selector block at a previous block and from which the D/A-converted voltage is output, and wherein I≥3.

15. A circuit device comprising:
the D/A converter according to claim 1; and
a power source circuit that supplies a power source voltage to the D/A converter,
wherein the power source circuit has a reference voltage generation circuit that includes a third transistor and a fourth transistor and generates a reference voltage based on a work function difference between the third and fourth transistors, and supplies the reference voltage generated by the reference voltage generation circuit to the D/A converter as the power source voltage.

16. A circuit device comprising:
the D/A converter according to claim 1;
an A/D conversion unit that performs A/D conversion of a temperature detection voltage from a temperature sensor unit and outputs temperature detection data;
a processing unit that performs temperature compensation processing of an oscillation frequency based on the temperature detection data and outputs frequency control data for the oscillation frequency; and
an oscillation signal generation circuit that generates an oscillation signal at the oscillation frequency set by the frequency control data using the frequency control data from the processing unit and a vibrator,
wherein the oscillation signal generation circuit includes
a D/A conversion unit that has the D/A converter and performs D/A conversion of the frequency control data from the processing unit, and
an oscillation circuit that generates the oscillation signal using an output voltage of the D/A conversion unit and the vibrator.

17. An oscillator comprising:
the circuit device according to claim 16; and
the vibrator.

18. An electronic apparatus comprising the D/A converter according to claim 1.

19. A moving object comprising the D/A converter according to claim 1.

20. A D/A converter comprising:
a decoder that performs decoding processing of input data and outputs a control signal;
a voltage generation circuit that generates and outputs a plurality of voltages; and
a voltage selection circuit that selects and outputs a voltage corresponding to the input data as a D/A-converted voltage from the plurality of voltages based on the plurality of voltages from the voltage generation circuit and the control signal from the decoder,
wherein the voltage selection circuit includes a plurality of stages of selector blocks in which an output of a selector of selector blocks at a previous stage of the plurality of stages is input to selectors of respective selector blocks at a subsequent stage of the plurality of stages,
the plurality of voltages are input to the selector block at a first stage of the plurality of stages of selector blocks, and the selector block at a final stage of the plurality of stages of selector blocks outputs the D/A-converted voltage,
each of the plurality of stages of selector blocks includes a plurality of transistors and, of the plurality of transistors forming the selector block, a second transistor on a far side from a power source node is set to a lower threshold voltage than that of a first transistor on a near side from the power source node, and
of the plurality of transistors forming the selector block, a second P-type transistor on a far side from a high-potential-side power source node is set to a lower threshold voltage than that of a first P-type transistor on a near side from the high-potential-side power source node, and a second N-type transistor on a far side from a low-potential-side power source node is set to a lower threshold voltage than that of a first N-type transistor on a near side from the low-potential-side power source node.

21. A D/A converter comprising:
a decoder that performs decoding processing of input data and outputs a control signal;
a voltage generation circuit that generates and outputs a plurality of voltages; and
a voltage selection circuit that selects and outputs a voltage corresponding to the input data as a D/A-converted voltage from the plurality of voltages based on the plurality of voltages from the voltage generation circuit and the control signal from the decoder,
wherein the voltage selection circuit includes a plurality of stages of selector blocks in which an output of a selector of selector blocks at a previous stage of the plurality of stages is input to selectors of respective selector blocks at a subsequent stage of the plurality of stages,
the plurality of voltages are input to the selector block at a first stage of the plurality of stages of selector blocks, and the selector block at a final stage of the plurality of stages of selector blocks outputs the D/A-converted voltage,
each of the plurality of stages of selector blocks includes a plurality of transistors and, of the plurality of transistors forming the selector block, a second transistor on a far side from a power source node is set to a lower threshold voltage than that of a first transistor on a near side from the power source node, and
the first transistor and the second transistor are different in gate length.

* * * * *